(12) United States Patent
Nakahata et al.

(10) Patent No.: US 7,528,055 B2
(45) Date of Patent: May 5, 2009

(54) METHOD OF PRODUCING A NITRIDE SEMICONDUCTOR DEVICE AND NITRIDE SEMICONDUCTOR DEVICE

(75) Inventors: Seiji Nakahata, Hyogo (JP); Koji Uematsu, Hyogo (JP); Hideaki Nakahata, Hyogo (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 296 days.

(21) Appl. No.: 11/514,979

(22) Filed: Sep. 5, 2006

(65) Prior Publication Data

US 2007/0054476 A1 Mar. 8, 2007

(30) Foreign Application Priority Data

Sep. 5, 2005 (JP) ............................. 2005-255813

(51) Int. Cl.
*H01L 21/20* (2006.01)

(52) U.S. Cl. ................ 438/463; 438/483; 257/E21.601

(58) Field of Classification Search ................. 438/463, 438/483, 572, 604; 257/E21.601
See application file for complete search history.

(56) References Cited

U.S. PATENT DOCUMENTS 6,667,185 B2 * 12/2003 Ishibashi et al. ............ 438/483
6,737,683 B2 * 5/2004 Inoue et al. ................. 257/192
6,924,159 B2 * 8/2005 Usui et al. ................... 438/22

FOREIGN PATENT DOCUMENTS

| JP | 11-001399 | 1/1999 |
| JP | 2002-261014 | 9/2002 |
| JP | 2003-165799 | 6/2003 |
| JP | 2003-183100 | 7/2003 |

* cited by examiner

*Primary Examiner*—Chandra Chaudhari
(74) *Attorney, Agent, or Firm*—McDermott Will & Emery LLP

(57) ABSTRACT

$Al_x In_y Ga_{1-x-y} N$ ($0 \leq x \leq 1$; $0 \leq x \leq 1$; $0 \leq x+y \leq 1$) layered device chips are produced by the steps of preparing a defect position controlled substrate of $Al_x In_y Ga_{1-x-y} N$ ($0 \leq x \leq 1$; $0 \leq y \leq 1$; $0 \leq x+y \leq 1$) having a closed loop network defect accumulating region H of slow speed growth and low defect density regions ZY of high speed growth enclosed by the closed loop network defect accumulating region H, growing epitaxial upper layers B selectively on the low defect density regions ZY, harmonizing outlines and insides of device chips composed of the upper layers B with the defect accumulating region H and the low defect density regions ZY respectively, forming upper electrodes on the upper layers B or not forming the electrodes, dissolving bottom parts of the upper layers B by laser irradiation or mechanical bombardment, and separating the upper layer parts B as device chips C from each other and from the substrate S. Chip-separation is done instantly by the high power laser irradiation or mechanical shock without cutting the substrate S. The defect position controlled substrate S is repeatedly reused.

68 Claims, 25 Drawing Sheets regular hexagon equilateral triangle parallelogram

LED

Schottky Diode

Vertical transistor

METHOD OF PRODUCING A NITRIDE SEMICONDUCTOR DEVICE AND NITRIDE SEMICONDUCTOR DEVICE

RELATED APPLICATION

This application claims priority to Japanese Patent Application No. 2005-255813 filed Sep. 5, 2005.

BRIEF DESCRIPTION OF THE INVENTION

This invention relates to a method of making a low defect density nitride semiconductor device with a small number of steps and a low defect density nitride semiconductor device produced by the method.

BACKGROUND OF THE INVENTION

① Japanese Patent Laying Open No. 2002-261014 "method of making nitride semiconductor devices" proposes a method of making LDs by the steps of preparing a foreign material (e.g., sapphire) substrate of a thickness more than 3 mm, growing an InGaN buffer layer of a thickness less than 0.3 μm on the sapphire substrate, growing an over-100 μm thick GaN crystal on the buffer layer, obtaining a GaN substrate by eliminating the sapphire substrate (wafer), piling thin epitaxial layers on the GaN substrate, dividing the GaN wafer into LED device chips and producing LED devices.

The method of ① produces an epitaxial GaN wafer (substrate) by preparing a sapphire ($Al_2O_3$) or spinel ($MgAl_2O_4$) wafer, making a buffer layer on the wafer, growing a thin GaN layer on the buffered layer, eliminating the sapphire wafer by polishing, obtaining an independent GaN substrate (as-cut wafer), polishing the as-cut GaN wafer into a mirror GaN wafer, piling epitaxially a GaN buffer layer, a crack-preventing layer, an n-cladding layer, an n-photoguide layer, an active layer, a p-capping layer, a p-photoguide layer, a p-cladding layer and a p-contact layer in order on the GaN wafer. Every unit on the wafer is shaped into a ridge shape by etching away both sides of the p-type layers. Further n-electrodes and p-electrodes are formed on an exposed n-layer and a top p-layer of the device units on the wafer respectively. The processed wafer is scribed along lengthwise and crosswise boundaries of the units and is divided mechanically into individual device chips. The method requires two polishing steps and one mechanical chip-separation step.

② Japanese Patent Laying Open No. 11-001399, "method of producing gallium nitride semiconductor single crystal substrate and gallium nitride diodes utilizing the substrate", proposes a GaN substrate producing method by growing a thick GaN film on a sapphire wafer, removing the sapphire wafer by polishing, obtaining an GaN substrate, growing a thick GaN film on the GaN wafer, polishing surfaces of the GaN crystal substrate and obtaining a GaN mirror wafer. The method ② requires two polishing steps, one is for eliminating the sapphire wafer and the other is for making a GaN mirror wafer. When device units are made by piling n-type and p-type InGaN, AlGaN and GaN films on the GaN wafer, the device units should be separated from each other by scribing and dividing the processed wafer into device units by mechanical methods of using cutlery. The divided device units are called "chips". The chip is composed of a thick substrate (a part of the wafer) and thin epitaxial films grown on the substrate. The substrate occupies most of the volume of a chip. ③ Japanese Patent Laying Open No. 2003-165799 and ④ Japanese Patent Laying Open No. 2003-183100 have no direct relation with a method of producing nitride semiconductor devices. Thus ③ and ④ are not the nearest prior art to the present invention. However, ③ and ④ work an important role in the present invention. Thus ③ and ④ are now clarified.

③ Japanese Patent Laying Open No. 2003-165799 discloses a new method of producing a GaN substrate contrived by the same Inventors as the present invention. ③ gives a basic technique of making a GaN substrate which acts as an important starting wafer in the present invention. ③ is clarified by referring to FIGS. 1-10. Isolated mask dots M ($SiO_2$, SiN, W, Pt, etc.) are allotted on an undersubstrate US (GaAs, SiC, sapphire, spinel single crystal etc.) as shown in FIG. 1. A surface of the undersubstrate US is divided into me aryask-covered parts and an exposed part. FIG. 7 is a sectional view of the same masked undersubstrate. Vapor phase growth produces a GaN crystal on the masked undersubstrate US. The mask has a function of suppressing growth. GaN growth starts only on the exposed part of the undersubstrate US. The mask dots delay crystal growth and form holes as shown in FIG. 2 and FIG. 3. Bottoms of the holes coincide with the mask dots. The holes are composed of several slanting walls. The slanting walls are facets F. Thus the holes are called "facet pits".

FIG. 8 is a sectional view of facet pits appearing in FIGS. 2 and 3. Facets F build hexagon cone pits or dodecagon cone pits above the isolated mask dots M. FIGS. 2 and 3 demonstrate the formation of simpler hexagon cone pits on dot masks M. No pit happens on an exposed part without mask dots. Maintaining the facet pits, ③ and ④ grow GaN on the masked undersubstrate without burying facet pits till the end of the growth. The facet-maintaining growth is called a "facet growth". FIG. 2 and FIG. 3 are different in the directions of the facets constructing the pits. Both facet pits shown by FIG. 2 and FIG. 3 can be prepared by adjusting growing conditions and determining a direction of the mask dot alignment on the undersubstrate. Dislocations D extend in directions perpendicular to a growing surface. Dislocations D on the facets move inward in the facet pits, and fall to the bottoms of the facet pits during the facet growth. Pit bottoms gather and arrest dislocations D. FIG. 9 is a section showing the growing GaN crystal with facets and pits. The parts which accumulate and accommodate many dislocations are called "defect accumulating regions H" on the masks M.

Other parts except H become low defect density single crystals. The parts below the facets on the exposed parts are called "low defect density single crystal regions Z", which have high electric conductivity. When the growing crystal is not fully covered with facets and is partially covered with C-planes, the parts growing under the C-planes are called "C-plane growth regions Y", which are low defect density single crystal regions of low electric conductivity. The C-plane growth regions Y should be discriminated from Z. Thus the parts are called the C-plane growth regions Y. Then the mask dots M are covered with the defect accumulating regions H as shown in FIG. 9. In the best case, the crystal growth proceeds on the facetted state shown in FIG. 4, in which facet pits are nearly in contact with each other.

When the crystal grows up to a sufficient height, the growth is finished. The grown crystal sample is taken out of a furnace. The facetted, rugged surface is eliminated by polishing. The undersubstrate is removed by grinding, etching or polishing. A flat, smooth freestanding GaN substrate (wafer) is obtained. FIG. 5 shows a plan view of the structure of the freestanding GaN wafer. FIG. 10 denotes a section of the same GaN wafer. The GaN wafer is not homogeneous but inhomogeneous. The GaN wafer (substrate) is composed of defect accumulating regions H, low defect density single crystal regions Z and C-plane growth regions Y arranged in a concentric relation. The GaN wafer is transparent, so that human eye sight cannot discriminate between the regions H, Z and Y. Cathode luminescence (CL) can clarify the structure composed of H, Z and Y. The growing method of ③ is called "dot-type facet growth method", since the mask dots M and the defect accumulating regions H are distributed as isolated, separated points. The defect accumulating region H is only an isolated point without patterning a closed loop.

Both the low defect density single crystal regions Z and the C-plane growth regions Y are single crystals of low defect density with the common orientation. Both Z and Y are collectively called "low defect density regions ZY" in the present invention. When the crystal has no C-plane growth region Y, the GaN crystal is only composed of H and Z as demonstrated by FIG. 6. In this case, the collective ZY includes only Z.

④ Japanese Patent Laying Open NO. 2003-183100 proposes another new method of producing gallium nitride substrates invented by the same inventors as the present invention. The new method forms mask stripes M on an undersubstrate US as shown in FIG. 11 and grows gallium nitride in vapor phase on the stripe masked undersubstrate US. The method is called a "stripe facet growth method". The mask has a function of suppressing crystal growth. The mask stripes M prevent GaN from growing thereon. Exposed parts between stripes promote growth. Grown crystals on the exposed parts make facets F and F on both sides. The stripes produce facet grooves formed with facing facets. GaN is grown on the masked undersubstrate by maintaining the facets and the grooves till the end. The facets convey dislocations into the facet groove bottoms. The groove bottoms arrest and accommodate dislocations.

FIG. 12 demonstrates such a function of the facets that the dislocations are conveyed to the facet grooves upon the stripes M. Dislocations D assemble on the mask stripes M. The stripes M are fully covered with dislocation-gathering crystals. The on-mask parts into which dislocations are converging are called "defect accumulating regions H". The defect accumulating regions H deprive the other parts of dislocations D. The other parts, which lose dislocations D, become low dislocation density regions, which are classified into two different regions. The regions growing under the facets F on the exposed parts are called "low defect density single crystal regions Z", and the other regions growing under C-plane on the exposed parts are called "C-plane growth regions Y", which are also low defect density single crystals. Y is different from Z in electric conductivity, although Z and Y are both low defect density single crystals. Y has low electric conductivity, and Z has high electric conductivity. When the GaN crystal is grown to a sufficient thickness, the growth is ended and the GaN crystal is taken out of a furnace. The GaN crystal has a rugged surface with facets. The facetted rugged surface is eliminated by polishing. A smooth surface GaN/undersubstrate is produced. Then the undersubstrate US is removed by polishing or etching. A smooth surfaced freestanding GaN substrate is obtained.

FIGS. 13 and 14 demonstrate final, flat, freestanding GaN substrates (wafers). FIG. 13 shows a GaN substrate (wafer) of an HZYZH structure with C-plane growth regions Y. FIG. 14 shows a GaN substrate (wafer) of an HZH structure without C-plane growth region Y. Appearance or disappearance of C-plane regions Y can be chosen by controlling the widths of the facets F in the stripe facet method. The growing method is called a stripe facet method, since the arrangements of the masks and the defect accumulating regions H are sets of parallel straight lines. In the stripe facet method, the defect accumulating regions H are isolated, straight, parallel and open lines. An open line means that the line has two open ends. At the point, the stripe facet method is different from the present invention, which proposes a set of closed loop H.

The low defect density single crystal regions Z and the C-plane growth regions Y are low dislocation density single crystals having the common crystal orientation. Then sometimes Z and Y are collectively called as low defect density regions "ZY" in the present invention. As explained hitherto, the dotted defect accumulating regions H in the dot facet method ③ are isolated points, which are zero-dimension points, and are not closed loops. The striped defect accumulating regions H in the stripe facet method ④ are isolated, parallel, straight lines, which are one-dimension lines, and are not closed loops.

Neither dot facet nor stripe facet methods, which make isolated or open line defect accumulating regions H, can serve undersubstrates which is applied to the present invention. However, the dot and stripe facet methods have been explained in detail, because these facet growth methods give the foundation of the present invention.

OBJECT AND SUMMARY OF THE PRESENT INVENTION

A purpose of the invention is to provide a method of making nitride semiconductor devices capable of reducing the steps of polishing, cutting and so on. Another purpose of the invention is to provide a nitride semiconductor devices of low defect density. A further purpose of the invention is to provide an economical method of reducing consumption of costly GaN substrates (wafers) by making use of the same nitride wafer many times repeatedly.

The present invention makes $Al_xIn_yGa_{1-x-y}N$ ($0 \leq x \leq 1$; $0 \leq y \leq 1$; $0 \leq x+y \leq 1$) layered device chips by the steps of preparing a defect position controlled substrate of $Al_xIn_yGa_{1-x-y}N$ ($0 \leq x \leq 1$; $0 \leq y \leq 1$; $0 \leq x+y \leq 1$) having a closed loop network defect accumulating region H with slow speed growth and low defect density regions ZY with high speed growth enclosed by the network H, growing epitaxial upper layers B selectively on the low defect density regions ZY, harmonizing outlines and insides of device chips composed of the upper layers B with the defect accumulating region H and the low defect density regions ZY respectively, forming upper electrodes on the upper layers B or not forming the electrodes, dissolving bottom parts of the upper layers B by laser irradiation or mechanical bombardment, and separating the upper layer parts B as device chips C from each other and from the substrate S. Chip-separation is done in a twinkle by the high power laser irradiation or mechanical shock without cutting the substrate S. The defect position controlled substrate S is repeatedly reused. The high speed growth means that nitride semiconductor crystals grow at a high speed on a part of the substrate. The low speed growth denotes that nitride semiconductor crystals grow at a low speed on another part of the substrate S. The speed does not mean the growing speed of the components of the substrate itself.

It is verbose to write the substrate in which the positions of closed loop defect accumulating regions of a low growing speed and the positions of the low defect density regions of a high growing speed are predetermined. To avoid the lengthy wording, the starting substrate having definite positions of defect regions is called a "defect position controlled substrate S" from now onward. The defect position controlled substrate S is made by the methods proposed by ③ Japanese Patent Laying Open No. 2003-165799 and ④ Japanese Patent Laying Open No. 2003-183100. The defect regions correspond to the defect accumulating regions H, and the low defect regions correspond to the low defect density regions ZY. The defect position controlled substrate S is a substrate provided with not only definite positions of defect regions but also definite positions of low defect regions. The growth speed of nitride semiconductor crystals, e.g. GaN, InGaN, AlGaN, InN, AlN, AlInGaN and so on, is low on the defect accumulating regions, while the growth speed is high on the low defect regions. The diameters of the defect position controlled substrates S are 10 mm to 150 mm (6 inches).

Another important matter in the present invention is that the defect accumulating regions H build closed loops or repetitions of closed loops (network). A closed loop is a curve in which a virtual moving point starting from an arbitrary spot and moving oneway on the curve always returns to the starting spot after a travel with a finite length. The present invention makes closed loop defect accumulating regions H enclosing low defect density regions ZY. The shape of a low defect density region ZY enclosed by the closed loop defect accumulating regions H is determined to coincide with the shape of an object device chip. Then the present invention fits the shape of the low defect density regions ZY to the object chip. Unlike ③ and ④ which propose isolated points H (zero-dimension) or open straight lines H (one-dimension), the present invention employs closed loops H and a network composed of closed loops H (two-dimension), the closed loop coinciding with the object device. The shape of ZY is determined by the shape of a closed loop H. Any shape of ZY can be realized in the present invention by allotting the object shape to the closed loop mask M on an undersubstrate. The shape of the closed loop H is determined by the closed loop mask M in the present invention. Thus the present invention determines the shape of a closed loop mask M after the shape of an object device chip C. Arbitrary closed loops are applicable to the shapes of the defect accumulating regions H.

A plurality of AlInGaN layers epitaxially grown directly or indirectly on the defect position controlled substrate S are collectively called "upper layers B" or "upper layers parts B". Upper layers B have different layered structures which depend upon the kinds of object devices. In general upper layers B are a pile of thin films of n-type or p-type GaN, AlGaN, InGaN or AlInGaN with a variety of thicknesses. A defect position controlling substrate S is not a homogeneous wafer but an inhomogeneous wafer mosaicked with a low growth speed defect accumulating region H and high growth speed low defect density regions ZY. When nitride AlInGaN crystals are grown on the ZY/H mosaicked substrate S, the low defect density regions ZY allow the nitride crystal to grow at a high speed to a thick film but the defect accumulating region H prevents the nitride crystal from growing. The defect accumulating region H is hardly covered with the nitride crystal.

Thus the upper layer parts B are thick and rich upon the low defect density regions ZY of the defect position controlled substrate S. But the upper layer parts B are poor, thin and lean upon the defect accumulating regions H of the defect position controlled substrate S. In an ideal case, no upper layer part B exists on the defect accumulating regions H. The upper layers parts B feature such inhomogeneous growth on the defect position controlled substrate S. Growth of the upper layers B on the substrate S can be named "selective growth". The outline (outer line) of an object chip shall coincide with the inline (inner line) of the low-speed growth defect accumulating regions H. The inside of the object chip shall coincide with the high-speed growth low defect density regions ZY. The closed loop defect accumulating regions H give boundaries between two neighboring device units. A upper layer part B becomes a device chip. The upper layer parts B include a plurality of device chips. Sometimes the upper layer parts B include upper electrodes. Otherwise the upper layer parts B include no upper electrode. In the latter case, the upper electrodes shall be formed after chip-separation out of the wafer process. The above structure piles the upper layer parts B directly upon the defect position controlled substrate S (BS-structure).

There is another structure of inserting a separation layer Q with a special property, i.e. a narrow bandgap between the defect position controlled substrate S and the upper layer parts B (BQS-structure). Namely the separation layer Q is deposited upon the defect position controlled substrate S and upper layers B are grown on the separation layer Q. When the grown crystal is shot by a high power laser beam, only the separation layer Q absorbs the laser power, heats up and evaporates away. The upper layer parts B are instantly dissolved in a vertical direction from the substrate S.

The special property which is required for the separation layer Q is clarified. The bandgap of the separation layer Q is denoted by Egq. The bandgap of the defect position controlled substrate S is denoted by Egs. The bandgap of the j-th layer of the upper layer parts B is denoted by Egj. Conditions applied to the laser beam wavelength λ, the separation layer Q, the upper layer parts B and the defect position controlled substrate S are Egq $<hc/\lambda<$Egs and Egq $<hc/\lambda<\min\{Egj\}$. Here min{ ... } means the minimum of the values {0 ... }. Sometimes min{Egj} is written as min{Egj}=Egb. Egb is the minimum of the bandgaps of the layers constructing the upper layer parts B. In the inequalities, h is Plank's constant and c is the light velocity in vacuum.

Semiconductors and insulators allow the light of energy lower than the bandgap to pass and allow the light of energy higher than the bandgap to absorb. When the processed GaN wafer is irradiated by the laser light satisfying the above aboinequalities, the light is absorbed only by the separation layers Q. The light selectively heats the separation layers Q, leaving the upper layer parts B and the substrate S unheated. The separation layers Q absorbing the laser power are heated, dissolved, evaporated and removed. The upper layer parts B are instantly separated in a vertical direction from the defect position controlled substrate S.

In the upper layer parts B, the defect accumulating regions H are weak, poor and thin. The upper layer parts B are momentarily separated into chips in a horizontal direction from each other at the network H.

Upper layer parts B are separated from the substrate in the vertical direction and are divided from each other in the horizontal direction at the same time. Thus the step of chip-separation can be omitted. This is one of the most important advantages of the present invention.

The defect position controlled substrate S of AlInGaN, which is separated from the upper layer parts B (device chips), survives. The substrate S is not consumed, so it can be used again and again. Repeated reuse of the expensive AlInGaN substrate S is another big advantage of the present invention.

The present invention makes AlInGaN layered device chips by the steps of preparing a defect position controlled substrate S having a network defect accumulating region H with slow speed growth and low defect density regions ZY with high speed growth, growing epitaxial upper layers B selectively on the low defect density regions ZY, forming upper electrodes on the upper layers B or not forming the electrodes, dissolving bottom parts of the upper layers B by laser irradiation, and separating the upper layer parts B as device chips C from each other and from the substrate S. Chip-separation is done in a twinkle by the high power laser irradiation without cutting the substrate S. In the case, the bottom of the upper layers B should selectively absorb laser power.

Otherwise, the present invention makes AlInGaN layered device chips by the steps of preparing a defect position controlled substrate S having a network defect accumulating region H with slow speed growth and low defect density regions ZY with high speed growth, depositing a separation layer Q selectively upon the low defect density regions ZY, growing epitaxial upper layers B on the separation layer Q and forming upper electrodes on the upper layers B or not forming the electrodes, dissolving the separation layer Q by laser irradiation or mechanical bombardment, and separating the upper layer parts B as device chips C from each other and from the substrate S. Chip-separation is done in an instant without cutting the substrate S.

After the upper layers parts B (chips) are decoupled from the substrate, bottom electrodes are formed chip by chip. The formation of bottom electrodes out of the wafer process is a drawback of the present invention. Top electrodes can be made in the wafer process. Otherwise, top electrodes can be formed chip by chip after the division of chips.

Chip-separation is done at the same time the upper layer parts B are exfoliated from the defect position controlled substrate S. The present invention can dispense with the process of chip-separation by slicing a wafer into chips. Elimination of the wafer-division-chip-separation step enables the present invention to reduce fabrication processes and to decrease production cost.

The defect position controlled substrate S is left unimpaired. The same defect position controlled substrate can be repeatedly used as a substrate. The AlInGaN nitride semiconductor substrate S is so valuable. Repeated reuse of the costly defect position controlled substrate S retrenches effectively the cost of making nitride semiconductor devices.

165799 which makes low dislocation gallium nitride crystals by forming isolated mask dots on an undersubstrate, growing gallium nitride on the undersubstrate, forming facet pits whose bottoms are formed on the mask dots, maintaining the facet pits, making defect accumulating regions H below the facet pits on the dots and reducing dislocations in other regions.

Figure 1:
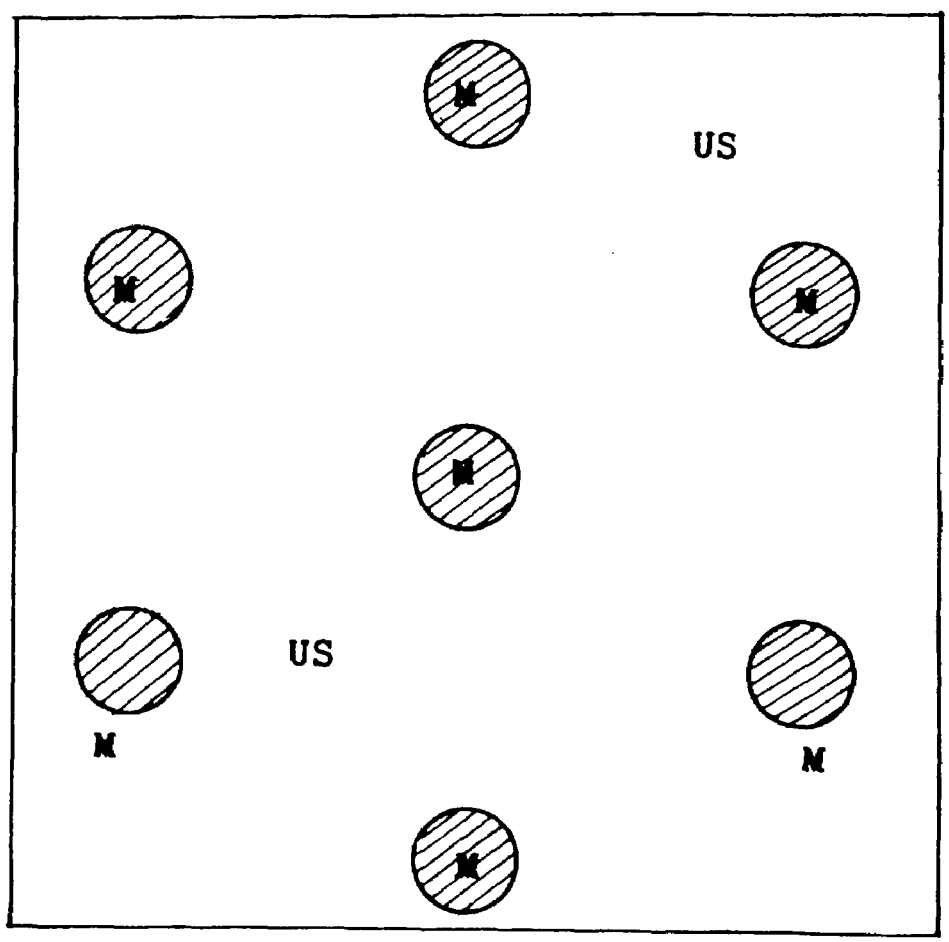
FIG. 1 is a plan view of an undersubstrate US with mask dots M at a first step of a dot facet growth method proposed by ③ Japanese Patent Laying Open No. 2003-165799 which makes low dislocation gallium nitride crystals by forming isolated mask dots on an undersubstrate, growing gallium nitride on the undersubstrate, forming facet pits on the mask dots, maintaining the facet pits, making defect accumulating regions H below the facet pits on the dots and reducing dislocations in other regions.
Figure 2:
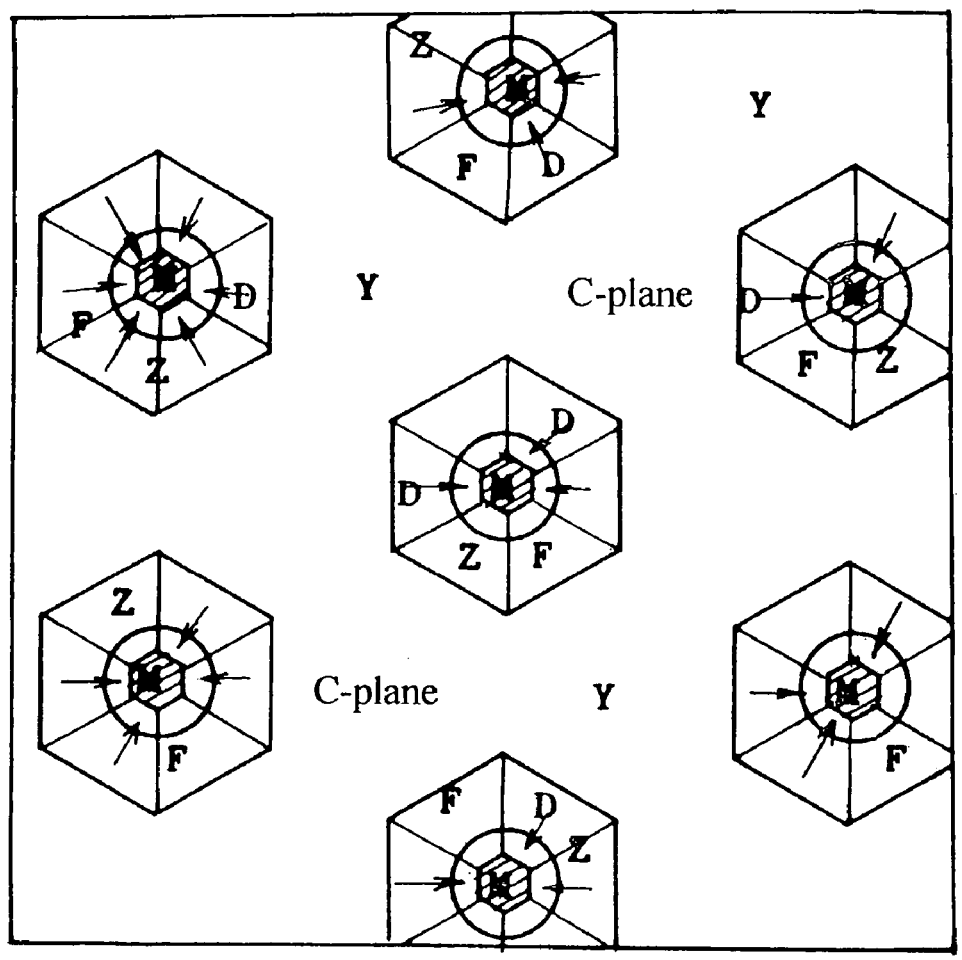
FIG. 2 is a plan view of a gallium nitride crystal grown on the dot-masked undersubstrate US and facet pits whose bottoms are formed on the mask dots for showing facets F sweeping dislocations D to pit bottoms at a second step of the dot facet growth method proposed by ③ Japanese Patent Laying Open No. 2003-165799 which makes low dislocation gallium nitride crystals by forming isolated mask dots on an undersubstrate, growing gallium nitride on the undersubstrate, forming facet pits on the mask dots, maintaining the facet pits, making defect accumulating regions H below the facet pits on the dots and reducing dislocations in other regions. Boundaries of facets are produced in the facet pits in directions parallel to the sides of equilateral triangles made by connecting three nearest neighboring dots M.
Figure 3:
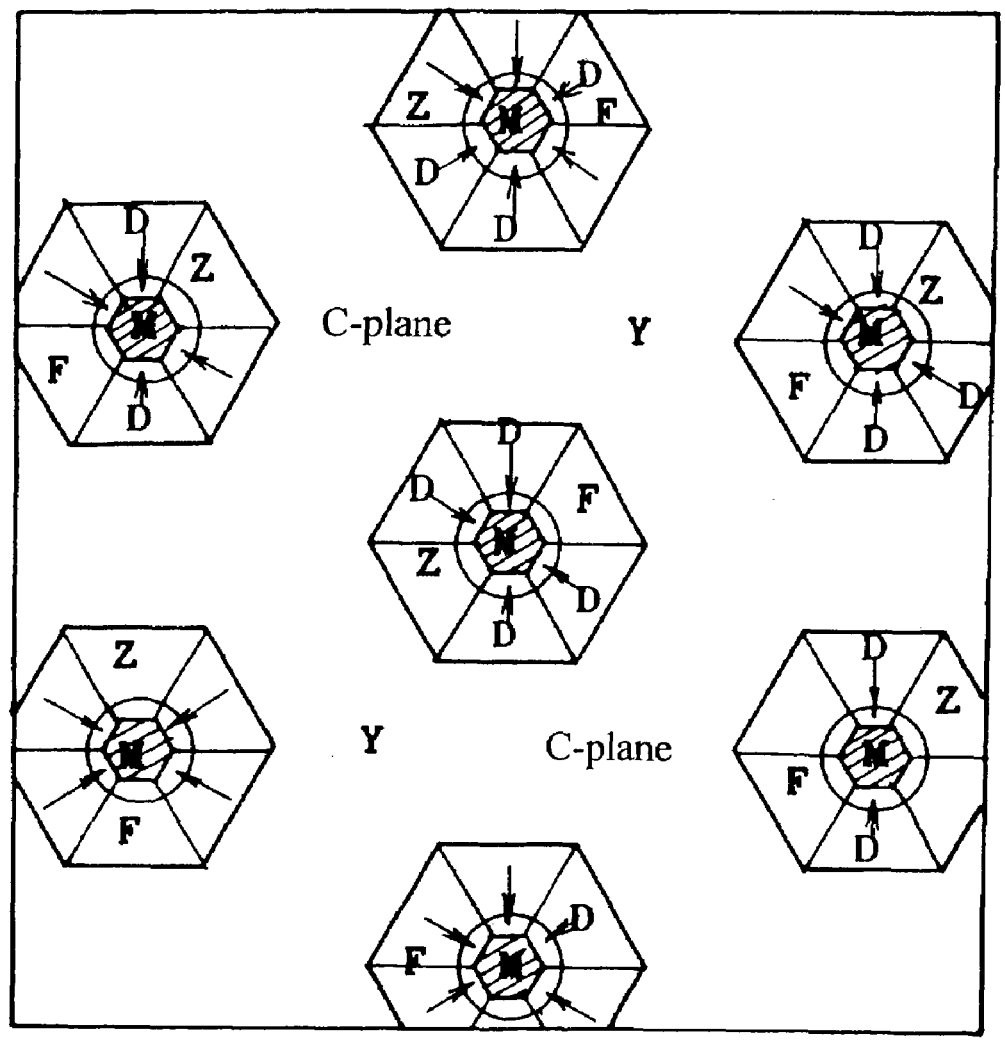
FIG. 3 is a plan view of a gallium nitride crystal grown on the dot-masked undersubstrate US and facet pits whose bottoms are formed on the mask dots for showing facets F sweeping dislocations D to pit bottoms at a second step of the dot facet growth method proposed by ③ Japanese Patent Laying Open No. 2003-165799 which makes low dislocation gallium nitride crystals by forming isolated mask dots on an undersubstrate, growing gallium nitride on the undersubstrate, forming facet pits on the mask dots, maintaining the facet pits, making defect accumulating regions H below the facet pits on the dots and reducing dislocations in other regions. Boundaries of facets are produced in the facet pits in directions parallel to the sides of equilateral triangles made by connecting three next-neighboring dots M.
Figure 4:
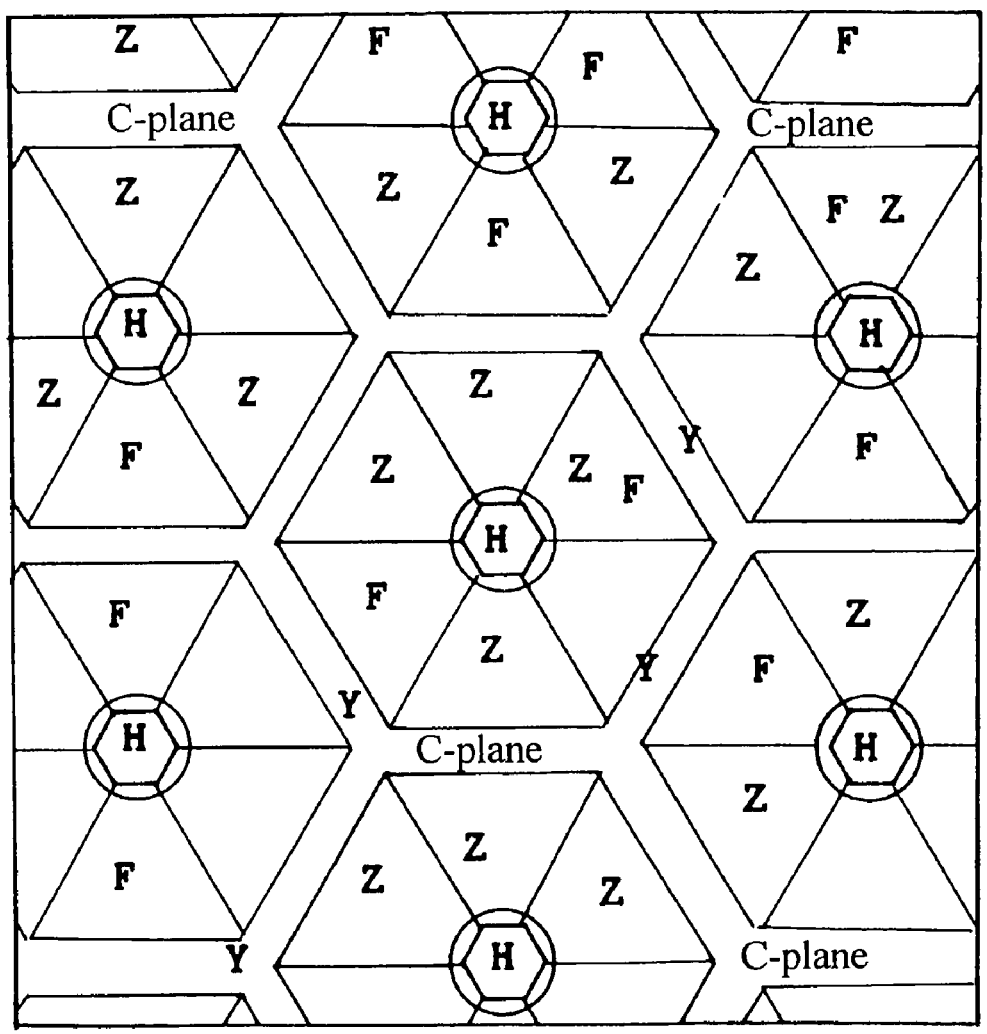
FIG. 4 is a plan view of a gallium nitride crystal highly grown on the dot-masked undersubstrate US and deepened facet pits whose bottoms are formed on the dots for showing facets F sweeping dislocations D to pit bottoms at a third step of the dot facet growth method proposed by ③ Japanese Patent Laying Open No. 2003-m which makes low dislocation gallium nitride crystals by forming isolated mask dots on an undersubstrate, growing gallium nitride on the undersubstrate, forming facet pits on the mask dots, maintaining the facet pits, making defect accumulating regions H below the facet pits on the dots and reducing dislocations in other regions.
Figure 5:
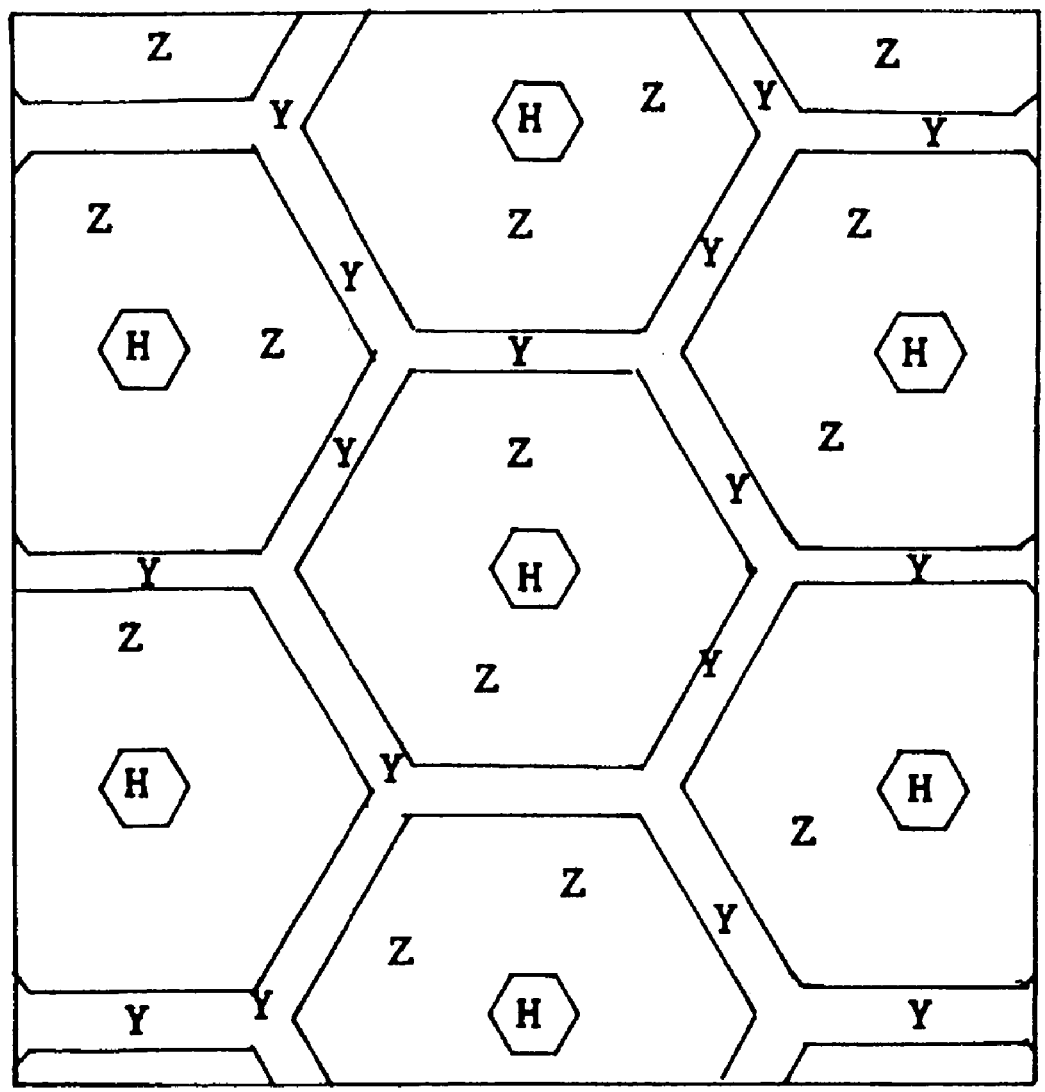
FIG. 5 is a plan view of a freestanding gallium nitride wafer obtained by removing the undersubstrate from the gallium nitride crystal highly grown on the dot-masked undersubstrate US for showing the gallium nitride wafer composed of defect accumulating regions H made on the mask dots, low defect density single crystal regions Z made below the facets and a C-growth region Y produced at a joint of the facets, the gallium nitride crystal being made by the dot facet growth method proposed by ③ Japanese Patent Laying Open No. 2003-165799 which makes low dislocation gallium nitride crystals by forming isolated mask dots on an undersubstrate, growing gallium nitride on the undersubstrate, forming facet pits whose bottoms are formed on the mask dots, maintaining the facet pits, making defect accumulating regions H below the facet pits on the dots and reducing dislocations in other regions.
Figure 6:
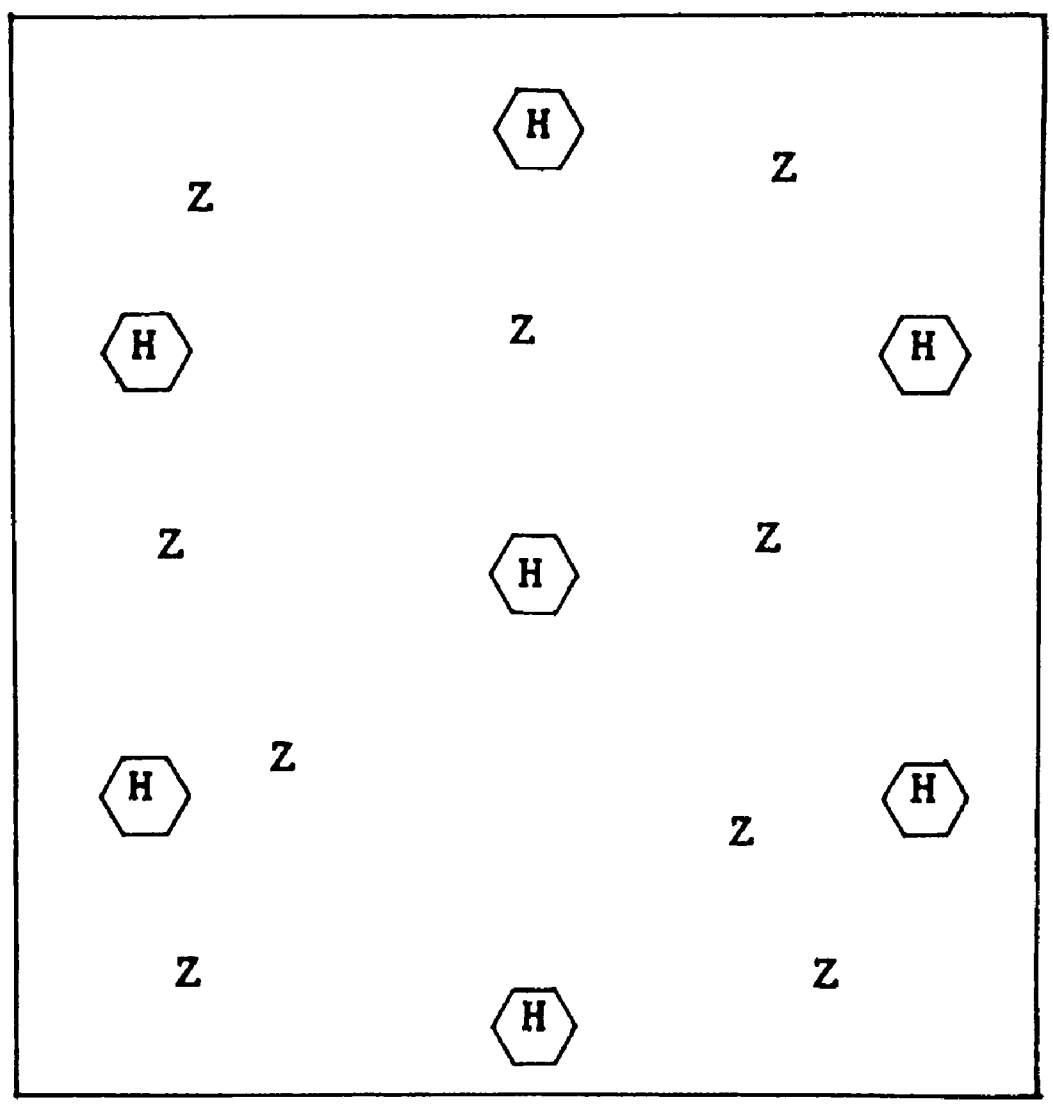
FIG. 6 is a plan view of a freestanding gallium nitride wafer obtained by removing the undersubstrate from the gallium nitride crystal highly grown on the dot-masked undersubstrate US for showing the gallium nitride wafer composed of defect accumulating region H made on the mask dots and low defect density single crystal regions Z made below the facets, the gallium nitride crystal being made by the dot facet growth method proposed by ③ Japanese Patent Laying Open No. 2003-165799 which makes low dislocation gallium nitride crystals by forming isolated mask dots on an undersubstrate, growing gallium nitride on the undersubstrate, forming facet pits whose bottoms are formed on the mask dots, maintaining the facet pits, making defect accumulating regions H below the facet pits on the dots and reducing dislocations in other regions.
Figure 7:
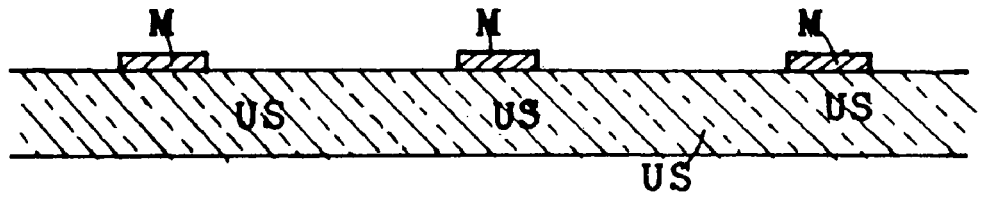
FIG. 7 is a vertically-sectioned view of an undersubstrate US with mask dots M at a first step of a dot facet growth method proposed by ③ Japanese Patent Laying Open No. 2003-165799 which makes low dislocation gallium nitride crystals by forming isolated mask dots on an undersubstrate, growing gallium nitride on the undersubstrate, forming facet pits whose bottoms are formed on the mask dots, maintaining the facet pits, making defect accumulating regions H below the facet pits on the dots and reducing dislocations in other regions.
Figure 8:
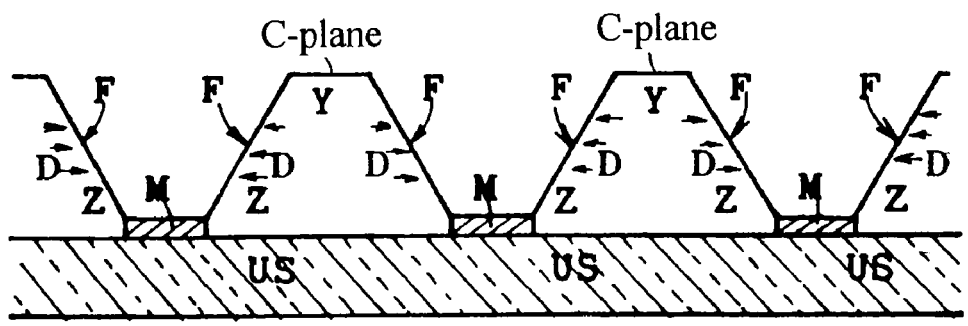
FIG. 8 is a vertically-sectioned view of a gallium nitride crystal grown on the dot-masked undersubstrate US and facet pits formed on the mask dots due to a delay of growth on the dots for showing facets F sweeping dislocations D to pit bottoms at a second step of the dot facet growth method proposed by ③ Japanese Patent Laying Open No. 2003-
Figure 9:
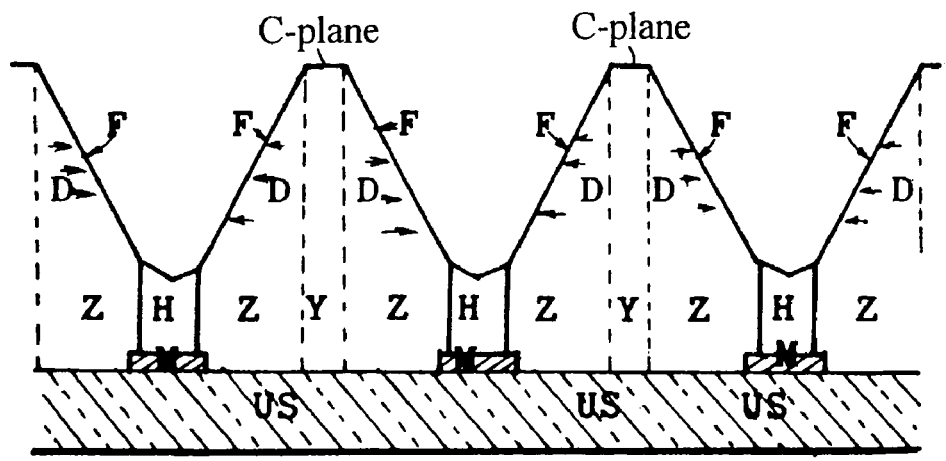

FIG. 9 is a vertically-sectioned view of a gallium nitride crystal highly grown on the dot-masked undersubstrate US and deepened facet pits whose bottoms are formed on the dots for showing facets F sweeping dislocations D to pit bottoms, the pit bottom producing defect accumulating regions H and the facets making low defect density single crystal regions Z therebelow and a C-plane joint making a C-plane growth region Y therebeneath at a third step of the dot facet growth method proposed by ③ Japanese Patent Laying Open No. 2003-165799 which makes low dislocation gallium nitride crystals by forming isolated mask dots on an undersubstrate, growing gallium nitride on the undersubstrate, forming facet pits whose bottoms are formed on the mask dots, maintaining the facet pits, making defect accumulating regions H below the facet pits on the dots and reducing dislocations in other regions.

Figure 10:
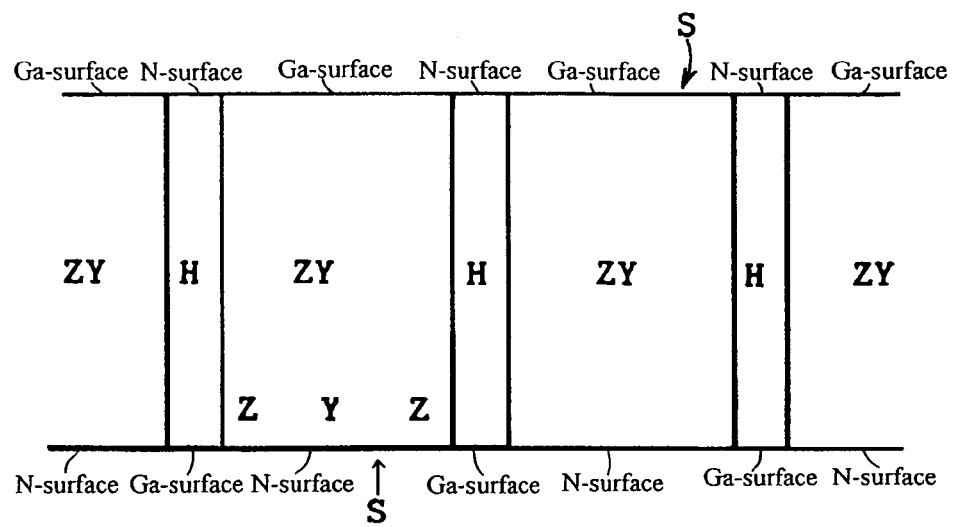

FIG. 10 is a vertically-sectioned view of a freestanding gallium nitride wafer obtained by removing the undersubstrate from the gallium nitride crystal highly grown on the dot-masked undersubstrate US for showing the gallium nitride wafer composed either of defect accumulating region H made on the mask dots, low defect density single crystal regions Z made below the facets and a C-growth region Y produced on a joint between facets or of defect accumulating region H made on the mask dots and low defect density single crystal regions Z made below the facets, the gallium nitride crystal being made by the dot facet growth method proposed by ③ Japanese Patent Laying Open No. 2003-165799 which makes low dislocation gallium nitride crystals by forming isolated mask dots on an undersubstrate, growing gallium nitride on the undersubstrate, forming facet pits on the mask dots, maintaining the facet pits, making defect accumulating regions H below the facet pits on the dots and reducing dislocations in other regions.

Figure 11:
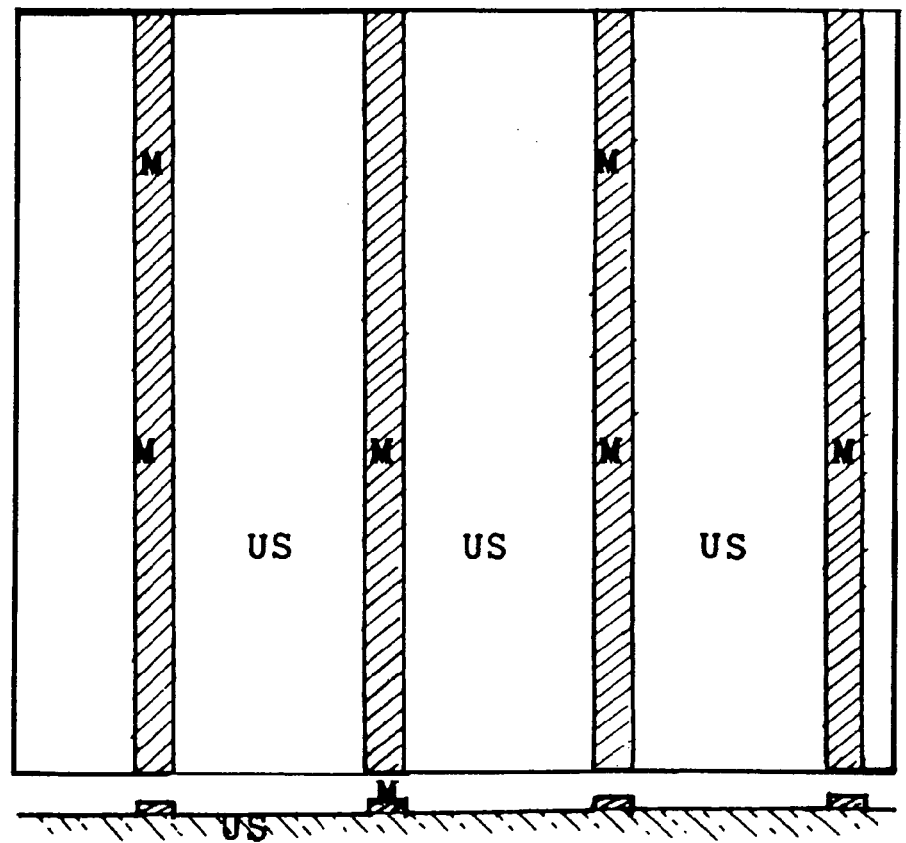

FIG. 11 is a plan view of an undersubstrate US with mask stripes M at a first step of a stripe facet growth method proposed by ④ Japanese Patent Laying Open No. 2003-183100 which makes low dislocation gallium nitride crystals by forming parallel straight mask stripes on an undersubstrate, growing gallium nitride on the undersubstrate, forming facet grooves on the mask stripes, maintaining the facet grooves, making defect accumulating regions H below the facet grooves on the stripes and reducing dislocations in other regions.

Figure 12:
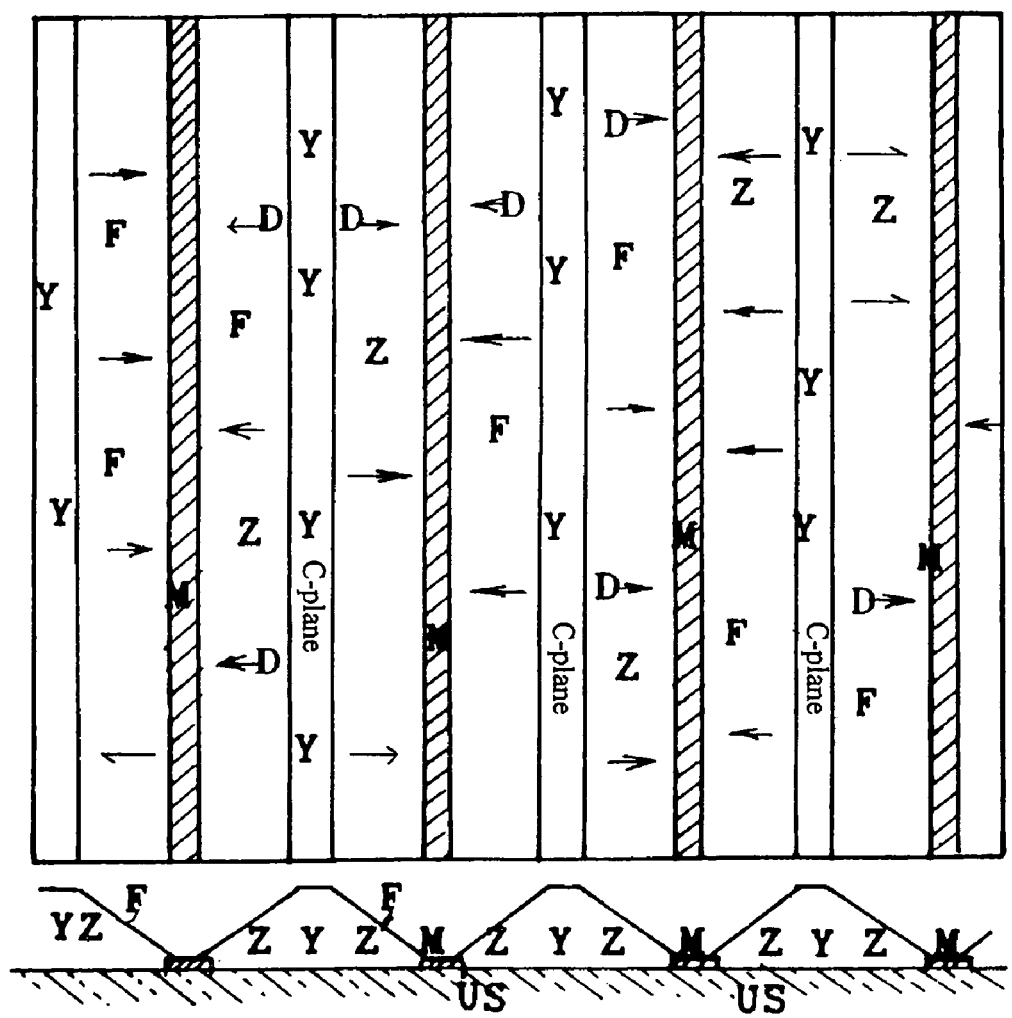

FIG. 12 is a plan view of a gallium nitride crystal grown upon an undersubstrate US with mask stripes M and parallel grooves of facets formed on the mask stripes for showing the facets F sweeping dislocations S into bottoms of the facet grooves at a second step of a stripe facet growth method proposed by ④ Japanese Patent Laying Open No. 2003-183100 which makes low dislocation gallium nitride crystals by forming parallel straight mask stripes on an undersubstrate, growing gallium nitride on the undersubstrate, forming facet grooves on the mask stripes, maintaining the facet grooves, making defect accumulating regions H below the facet grooves on the stripes and reducing dislocations in other regions.

Figure 13:
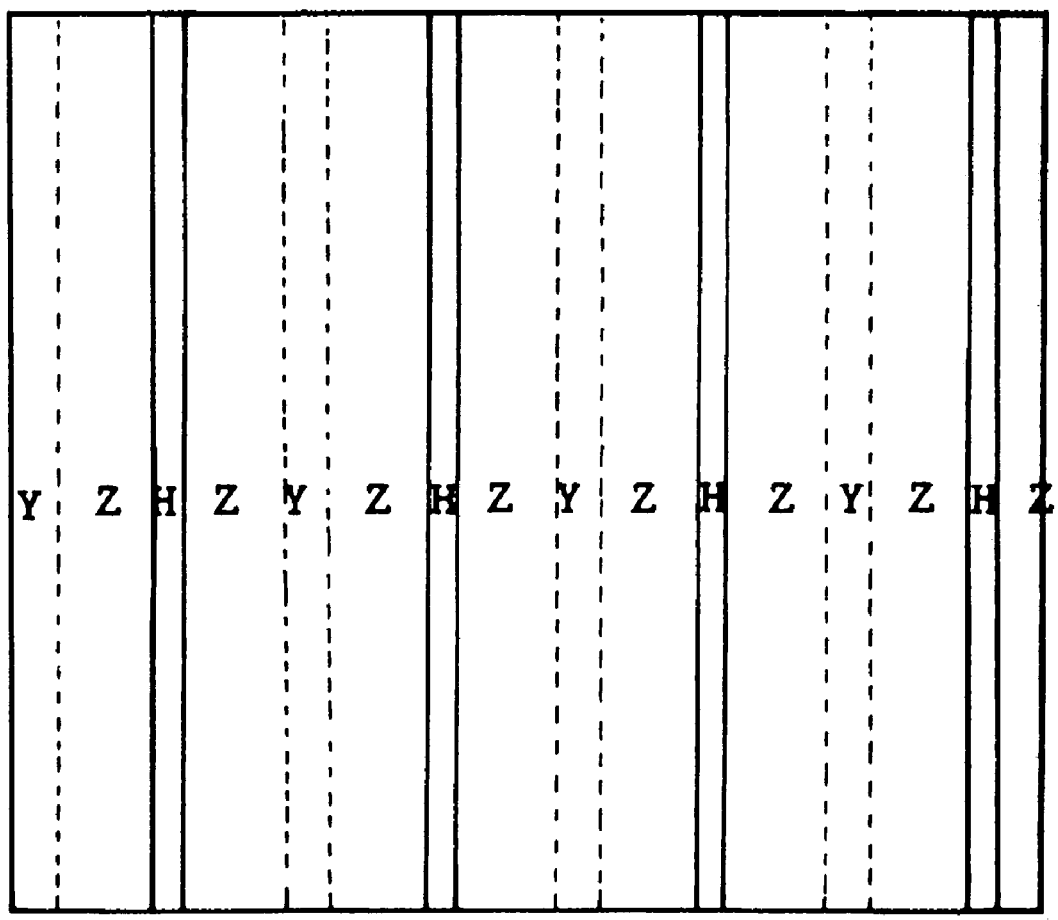

FIG. 13 is a plan view of a freestanding gallium nitride wafer obtained by removing the undersubstrate from the gallium nitride crystal grown upon the undersubstrate US with mask stripes M for showing the gallium nitride wafer being composed of defect accumulating regions H made on the mask stripes, low defect density single crystal regions Z made below the facets and C-plane growth regions Y produced on joints between facets, the gallium nitride crystal being made by the stripe facet growth method proposed by ④ Japanese Patent Laying Open No. 2003-183100 which makes low dislocation gallium nitride crystals by forming parallel straight mask stripes on an undersubstrate, growing gallium nitride on the undersubstrate, forming facet grooves on the mask stripes, maintaining the facet grooves, making defect accumulating regions H below the facet grooves on the stripes and reducing dislocations D in other regions.

Figure 14:
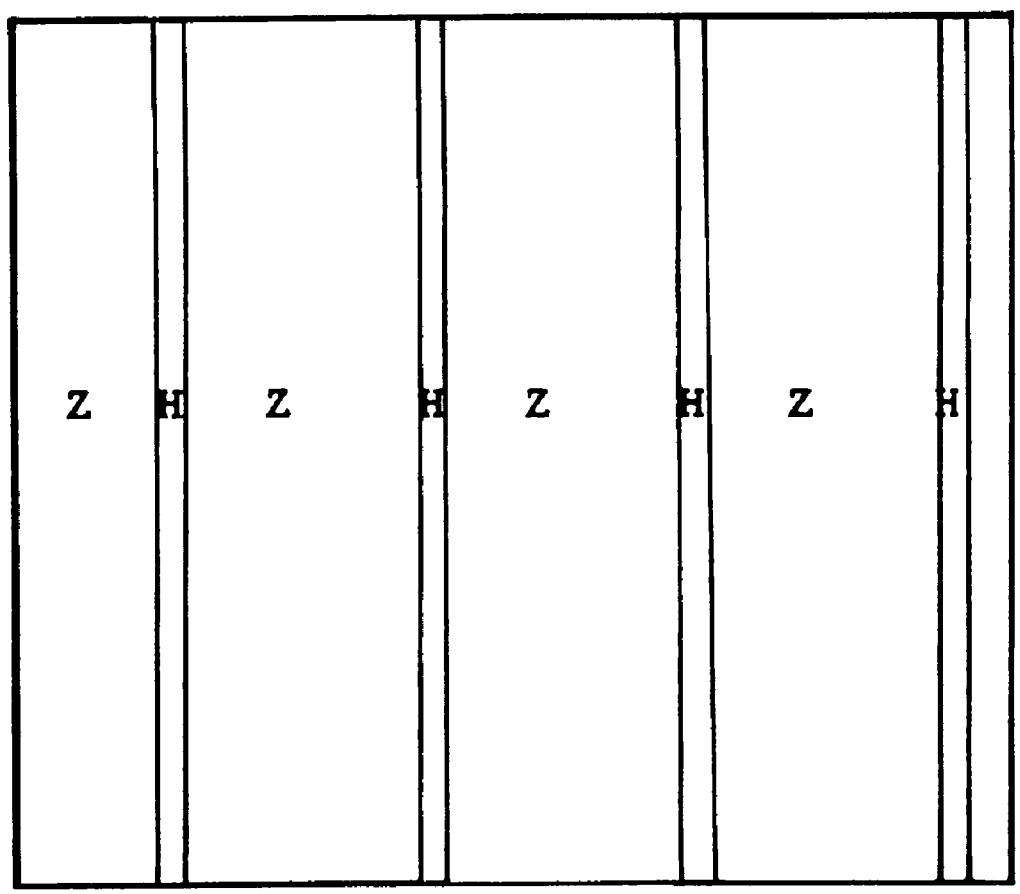

FIG. 14 is a plan view of a freestanding gallium nitride wafer obtained by removing the undersubstrate from the gallium nitride crystal grown upon the undersubstrate US with mask stripes M for showing the gallium nitride wafer being composed of defect accumulating regions H made on the mask stripes and low defect density single crystal regions Z made below the facets, the gallium nitride crystal being made by the stripe facet growth method proposed by ④ Japanese Patent Laying Open No. 2003-183100 which makes low dislocation gallium nitride crystals by forming parallel straight mask stripes on an undersubstrate, growing gallium nitride on the undersubstrate, forming facet grooves on the mask stripes, maintaining the facet grooves, making defect accumulating regions H below the facet grooves on the stripes and reducing dislocations in other regions.

Figure 15:
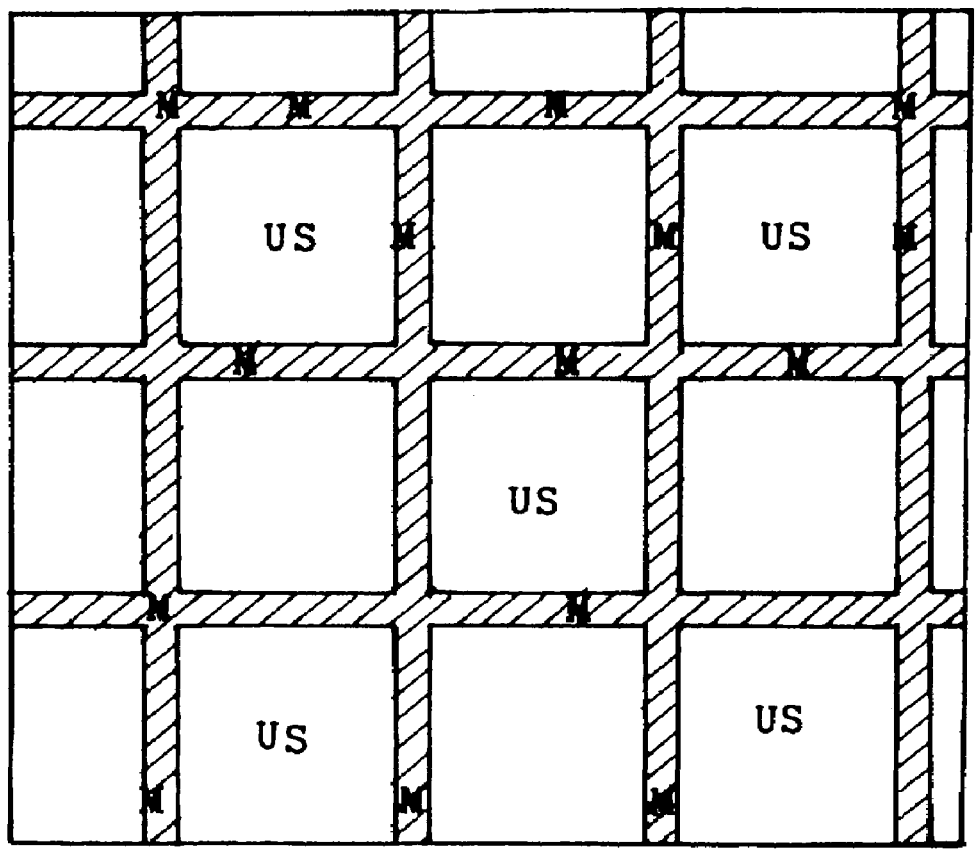

FIG. 15 is a plan view of an undersubstrate US having a square network mask M for growing an AlInGaN crystal thereupon by a facet growth method for preparing a defect position controlled undersubstrate S with closed loop defect accumulating regions H which are required of the present invention.

Figure 16:
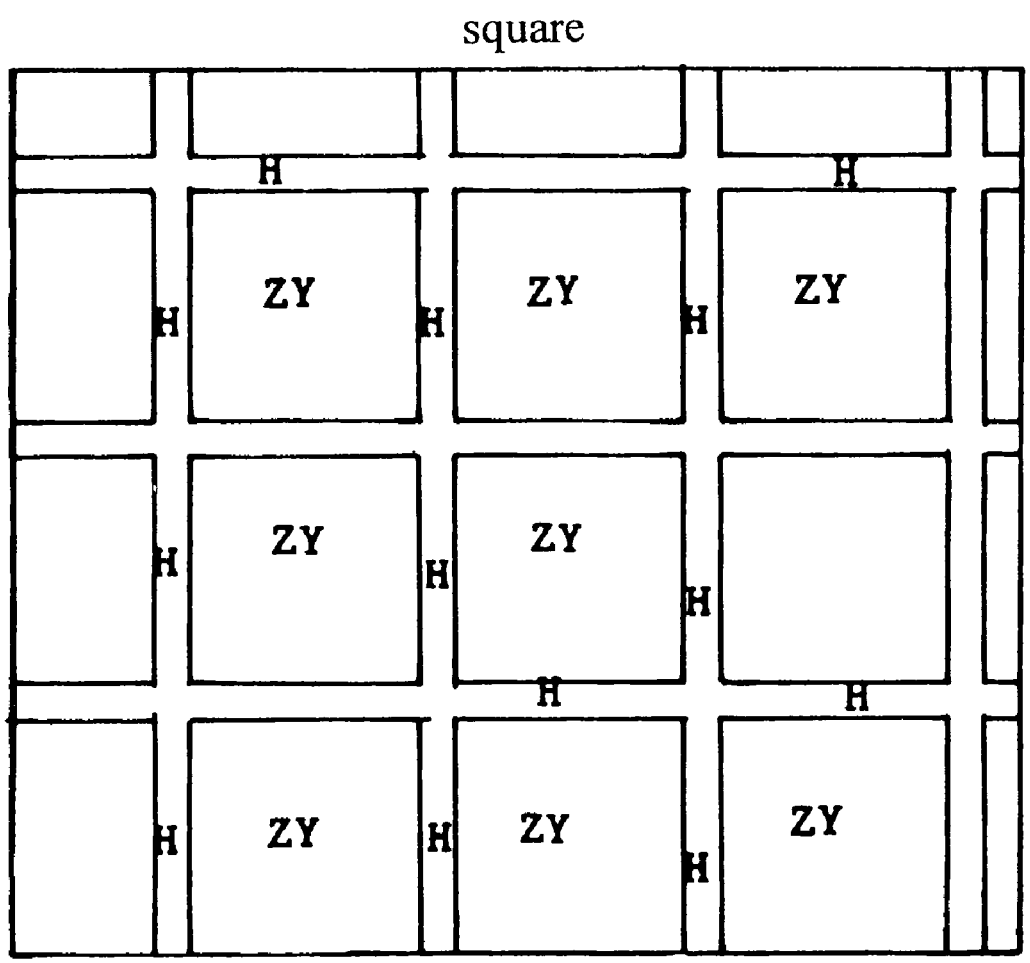

FIG. 16 is a plan view of a defect position controlled undersubstrate S with closed (square) loop defect accumulating regions H which are required of the present invention and are prepared by growing an AlInGaN crystal by a facet growth method on an undersubstrate having square network mask M and forming defect accumulating regions H on the square closed loop mask M.

Figure 17:
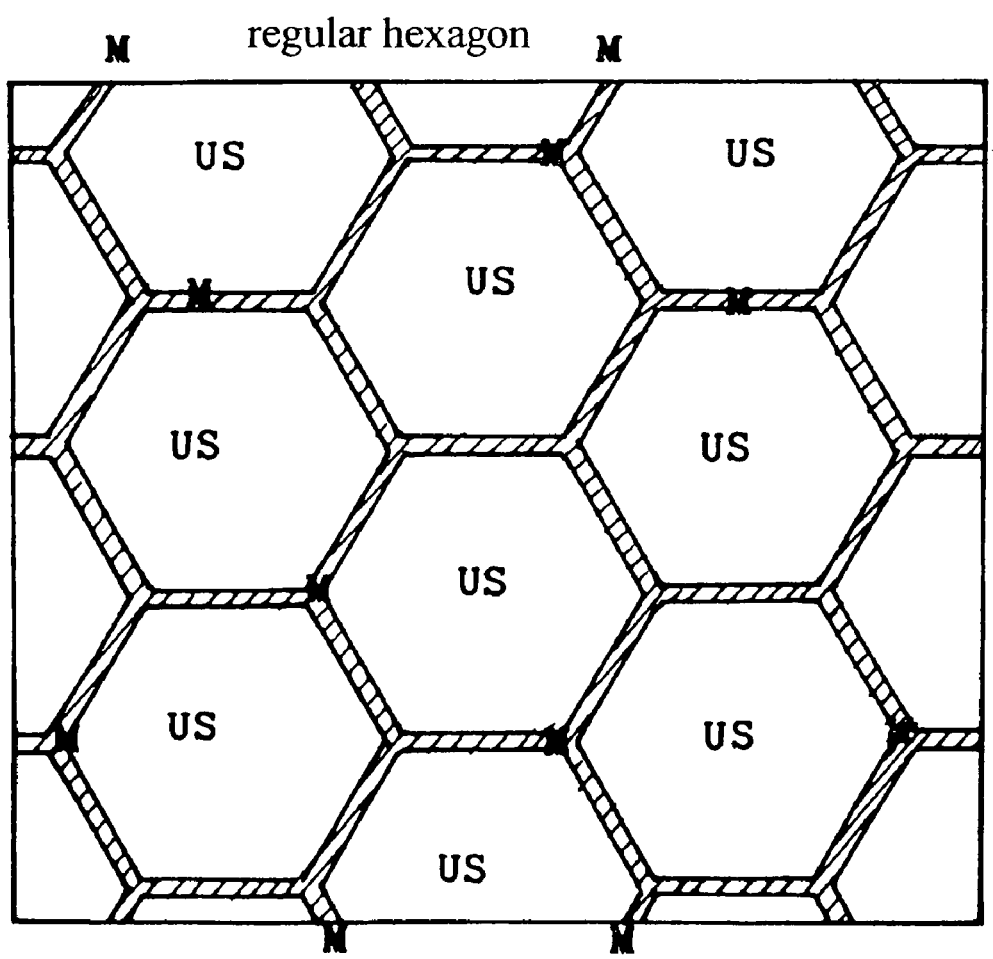

FIG. 17 is a plan view of an undersubstrate US having a hexagon network mask M for growing an AlInGaN crystal thereupon by a facet growth method for preparing a defect position controlled substrate S with closed loop (hexagon) defect accumulating regions H which are required of the present invention.

Figure 18:
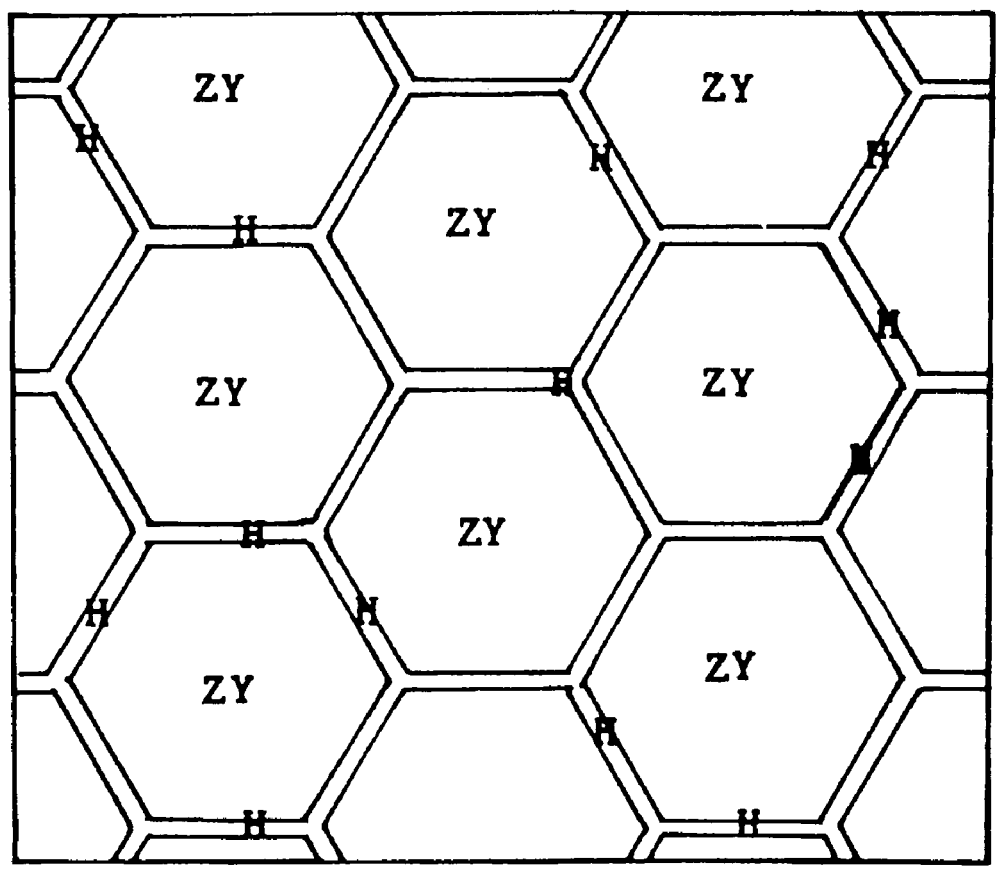

FIG. 18 is a plan view of a defect position controlled substrate S with closed (hexagon) loop defect accumulating regions H which are required of the present invention and are prepared by growing an AlInGaN crystal by a facet growth method on an undersubstrate US having a hexagon network mask M and forming defect accumulating regions H on the hexagon closed loop mask M.

Figure 19:
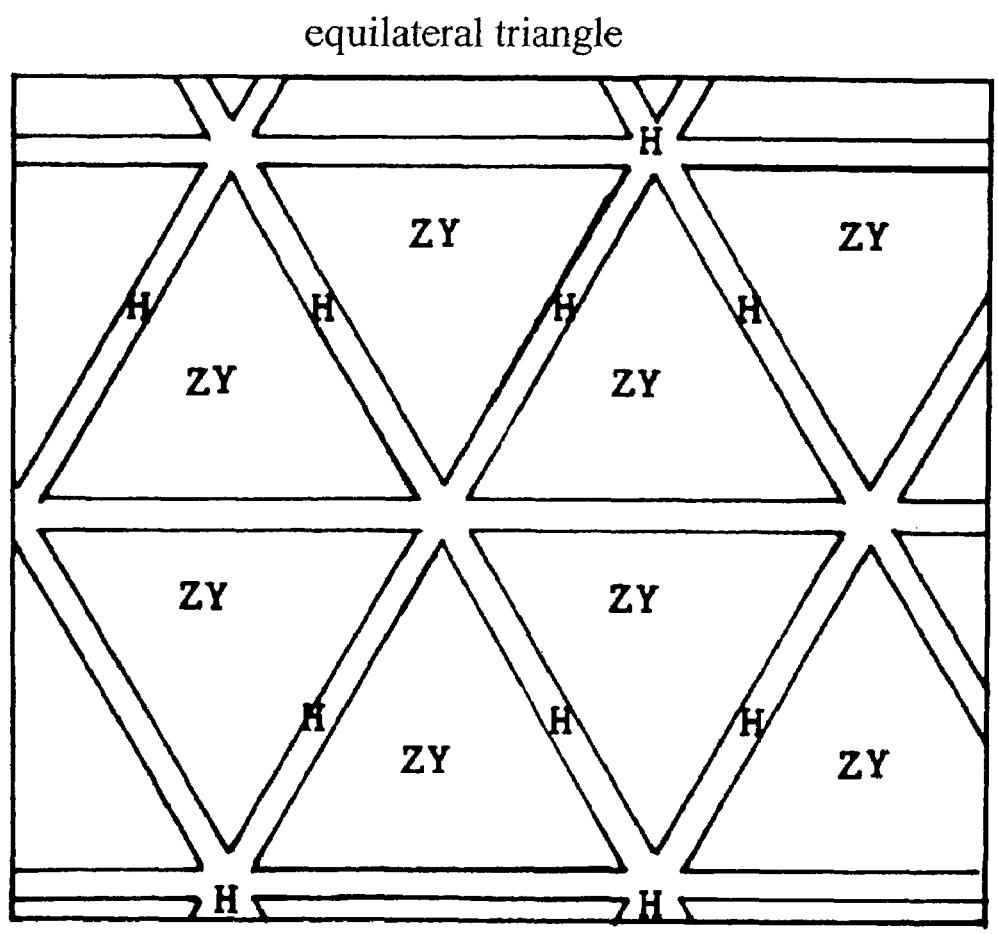

FIG. 19 is a plan view of a defect position controlled substrate S with closed (triangle) loop defect accumulating regions H which are required of the present invention and are prepared by growing an AlInGaN crystal by a facet growth method on an undersubstrate US having a triangle network mask M and forming defect accumulating regions H on the triangle closed loop mask M.

Figure 20:
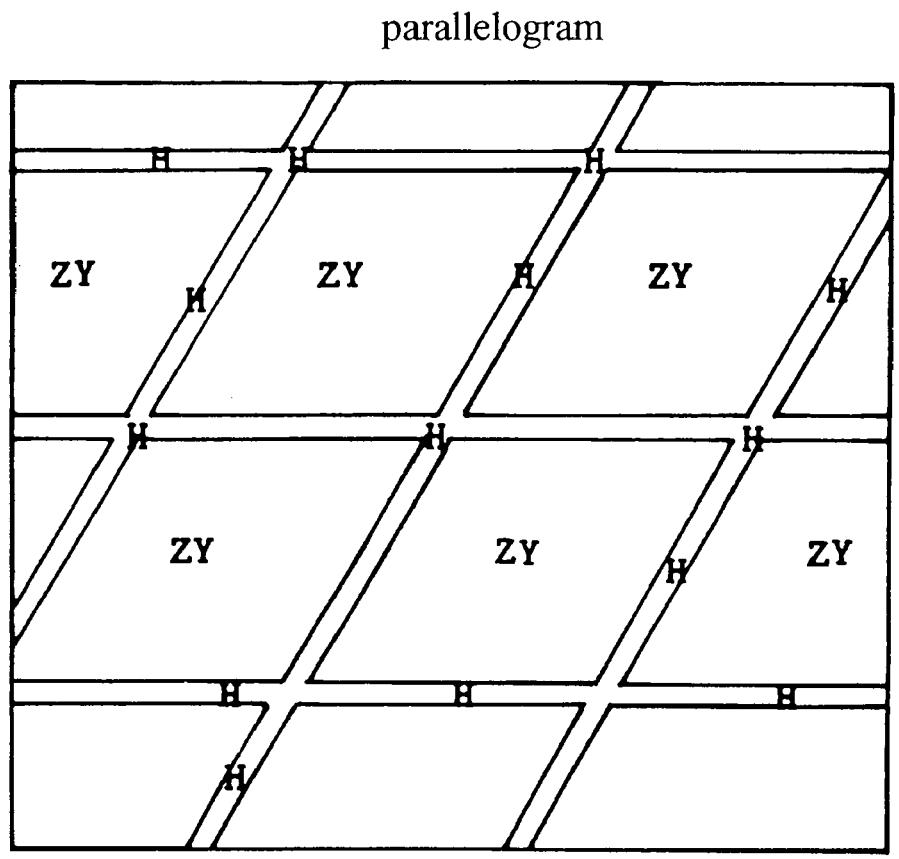

FIG. 20 is a plan view of a defect position controlled substrate S with closed (parallelogram) loop defect accumulating regions H which are required of the present invention and are prepared by growing an AlInGaN crystal by a facet growth method on an undersubstrate US having a parallelogram network mask M and forming defect accumulating regions H on the parallelogram closed loop mask M.

Figure 21:
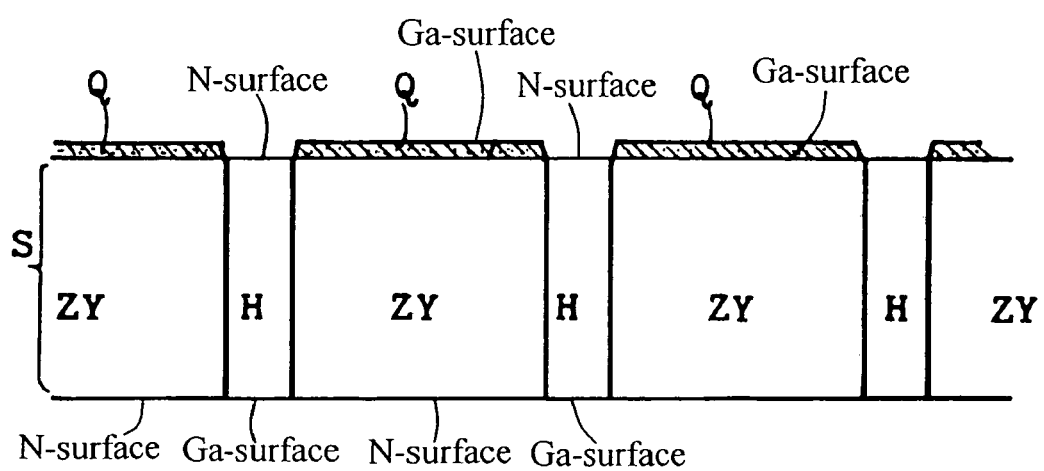

FIG. 21 is a sectional view of a defect position controlled substrate S and separation layers Q for clarifying the fact that separation layers do not grow on the defect accumulating regions H but grow on the low defect density regions Z and Y when the separation layers are grown on the defect position controlled substrate S including a network closed loop defect accumulating region H and low defect density regions Z/Y enclosed by the network defect accumulating region H.

Figure 22:
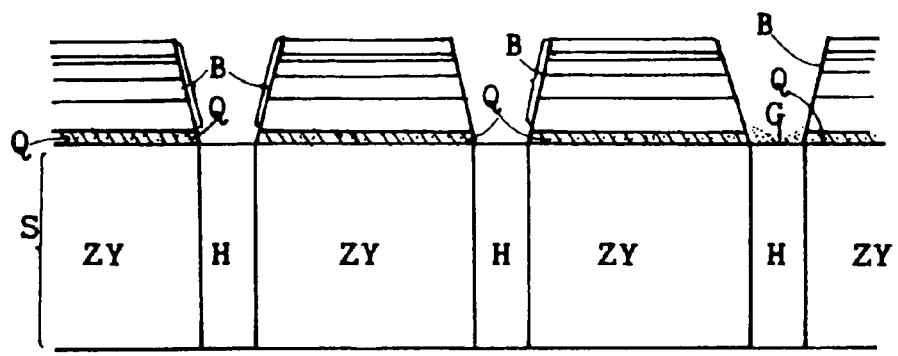

FIG. 22 is a sectional view of a defect position controlled substrate S, separation layers Q and upper layer parts B for clarifying the fact that the separation layers Q and the upper layer parts B do not grow on the defect accumulating regions H but grow on the low defect density regions Z and Y when the separation layers Q are grown on the defect position controlled substrate S including a network closed loop defect accumulating region H and low defect density regions Z/Y enclosed by the network defect accumulating region H.

Figure 23:
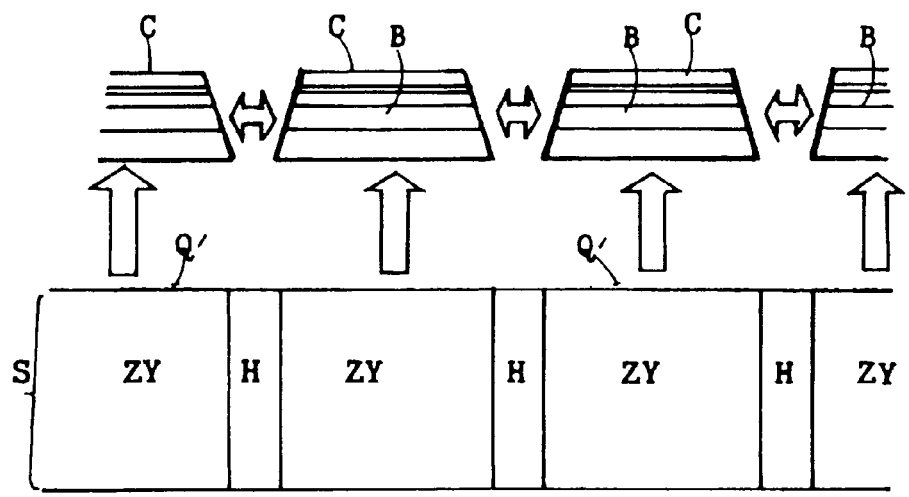

FIG. 23 is a sectional view of a defect position controlled substrate S, remains Q' of separation layers Q and upper layer parts B separated from the undersubstrate S for clarifying the fact that the separation layers Q and the upper layer parts B do not grow on defect accumulating regions H but grow on low defect density regions Z and Y when the separation layers Q are grown on the defect position controlled substrate S and the upper layer parts B are separated into device chip units B by applying stress to the undersubstrate S and the upper layer parts B by laser irradiation or mechanical means. The laser irradiation or mechanical means separates device chip units simultaneously in the horizontal direction and the vertical direction. Chip-separation dispenses with the dividing of substrate S.

Figure 24:
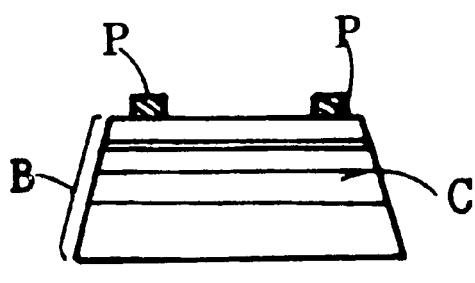

FIG. 24 is a vertical section of a device chip unit B provided with upper electrodes P which have been separated from the defect position controlled substrate S.

Figure 25:
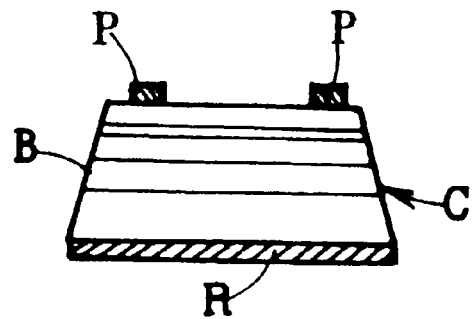

FIG. 25 is a vertical section of a device chip unit B provided with a bottom electrode R which has been separated from the defect position controlled substrate S.

Figure 26:
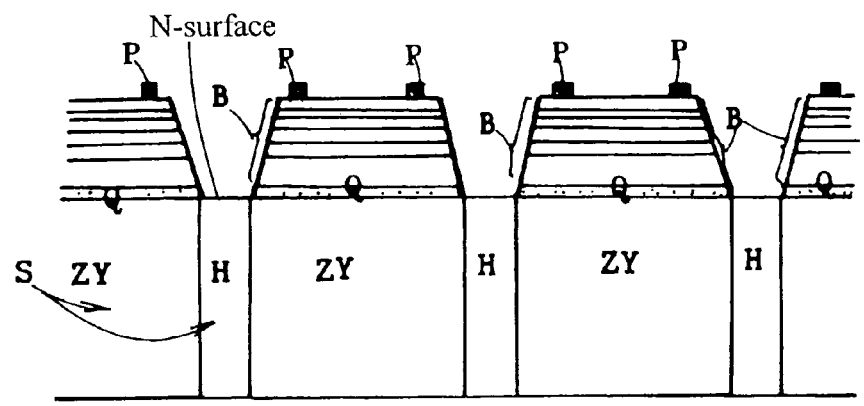

FIG. 26 is a sectional view of a defect position controlled substrate S, an upper layer part B piled on the defect position controlled substrate S via separation layers Q and upper electrodes P formed on the upper layer part B by wafer-processing.

Figure 27:
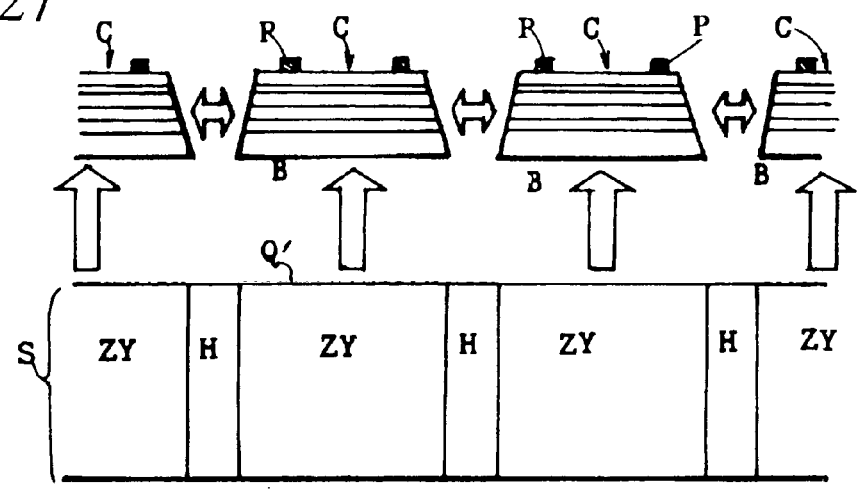

FIG. 27 is a sectional view of a defect position controlled substrate S, and an upper layer part B separated by mechanical means or optical means from the defect position controlled substrate S without cutting the substrate S, The separated defect position controlled substrate S can be repeatedly utilized as a substrate.

Figure 28:
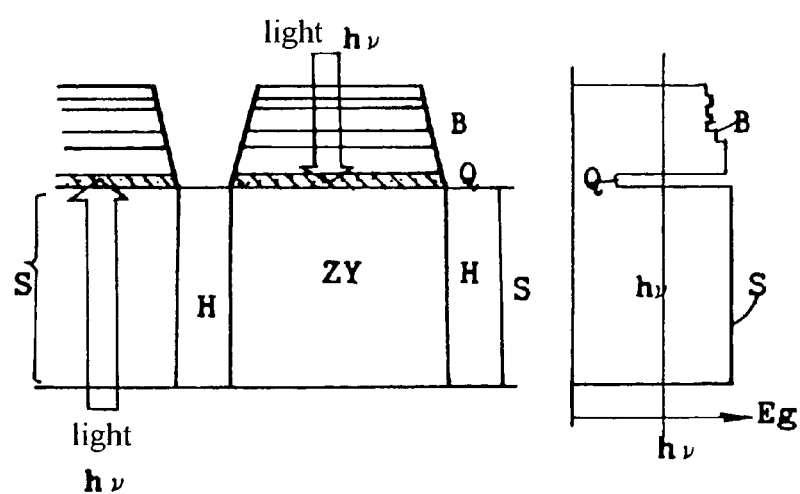

FIG. 28 is a sectional view of a defect position controlled substrate S, an upper layer part B piled on the defect position controlled substrate S via a separation layer Q for demonstrating that the light having energy (hv) higher than the band gap of the separation layer Q but lower than the band gap of the defect position controlled substrate S and the upper layer part B is neither absorbed by the upper layer part B nor by the substrate S, and the light reaches and heats the separation layer Q.

Figure 29:
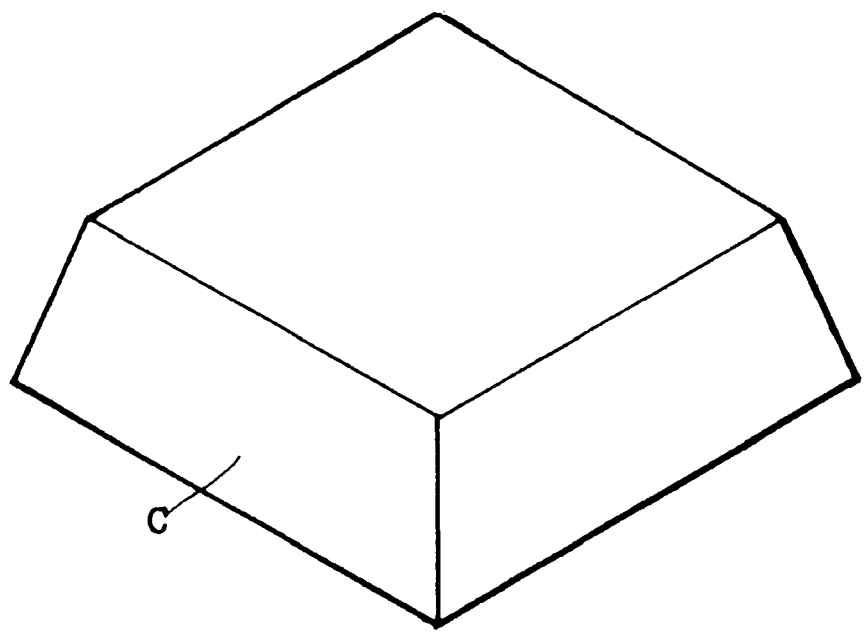

FIG. 29 is a perspective view of a device chip C of a square mesa-shaped upper layer part B which is obtained by growing nitride semiconductor layers via a separation layer Q or directly on a defect position controlled substrate S having a square network defect accumulating region H and low defect density regions Z/Y enclosed by the square H and separating the upper layer part B by a mechanical or an optical method from the defect position controlled substrate S.

Figure 30:
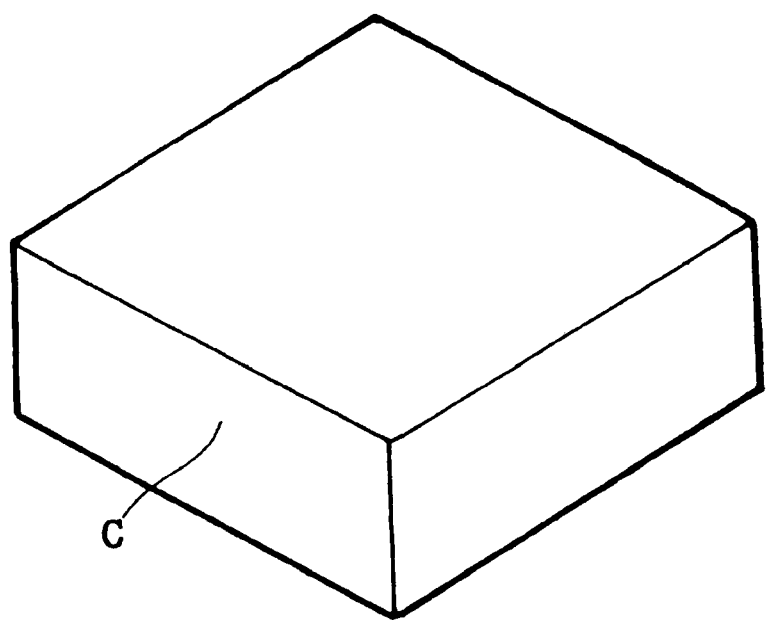

FIG. 30 is a perspective view of a square device chip with orthogonal ends and sides produced by polishing sides and ends of the mesa-shaped square chip of FIG. 29.

Figure 31:
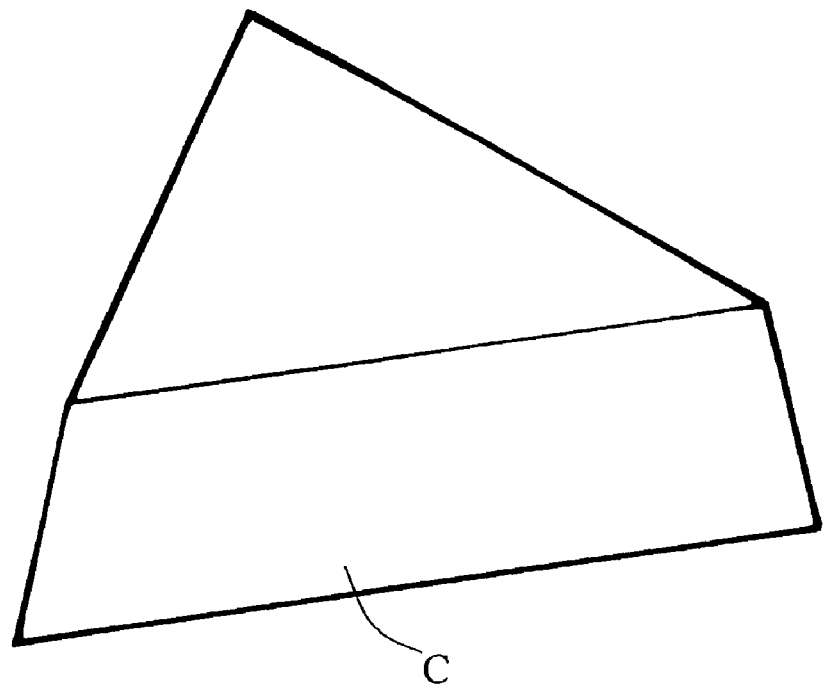

FIG. 31 is a perspective view of a device chip C of a triangle mesa-shaped upper layer part B which is obtained by growing nitride semiconductor layers via a separation layer Q or directly on a defect position controlled substrate S having a triangle network defect accumulating region H and low defect density regions Z/Y enclosed by the triangle H and separating the upper layer part B by a mechanical or an optical method from the defect position controlled substrate S.

Figure 32:
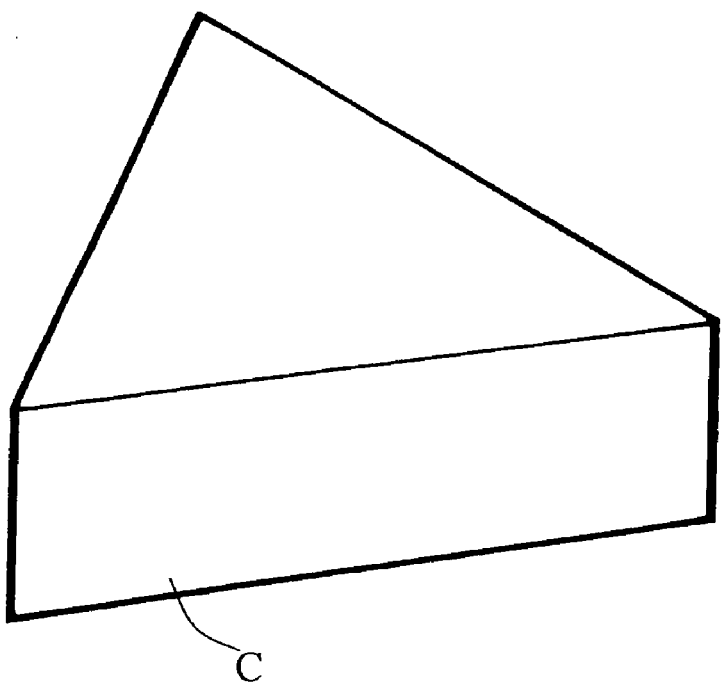

FIG. 32 is a perspective view of a triangle device chip with orthogonal ends and sides produced by polishing sides and ends of the mesa-shaped triangle chip of FIG. 31.

Figure 33:
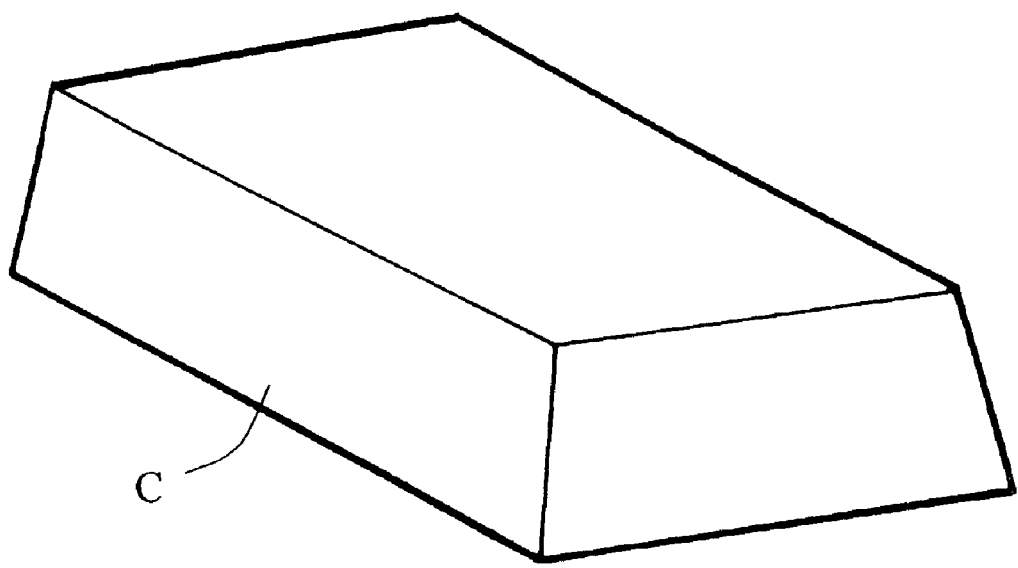

FIG. 33 is a perspective view of a device chip C of a parallelogram mesa-shaped upper layer part B which is obtained by growing nitride semiconductor layers via a separation layer Q or directly on a defect position controlled substrate S having a parallelogram network defect accumulating region H and low defect density regions Z/Y enclosed by the parallelogram H and separating the upper layer part B by a mechanical or an optical method from the defect position controlled substrate S.

Figure 34:
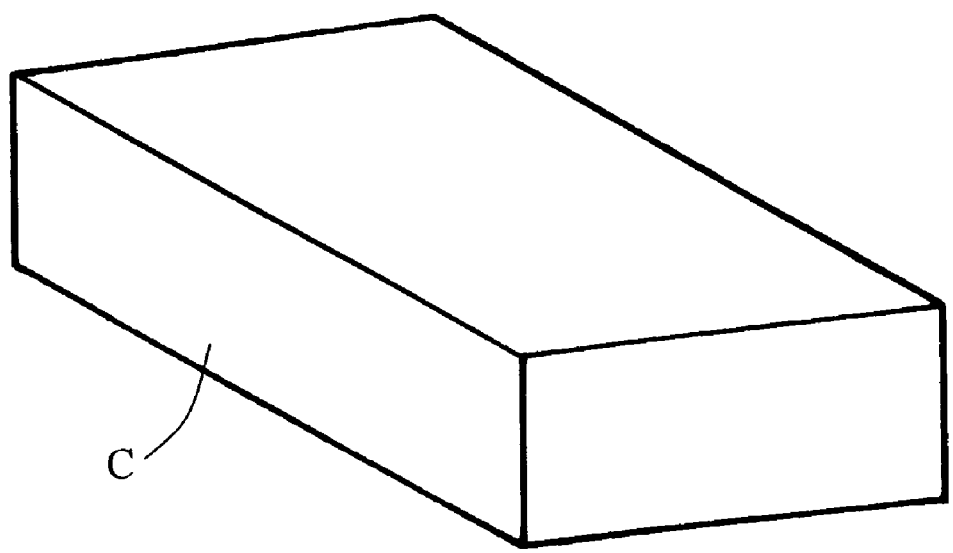

FIG. 34 is a perspective view of a parallelogram device chip with orthogonal ends and sides produced by polishing sides and ends of the mesa-shaped parallelogram chip of FIG. 33.

Figure 35:
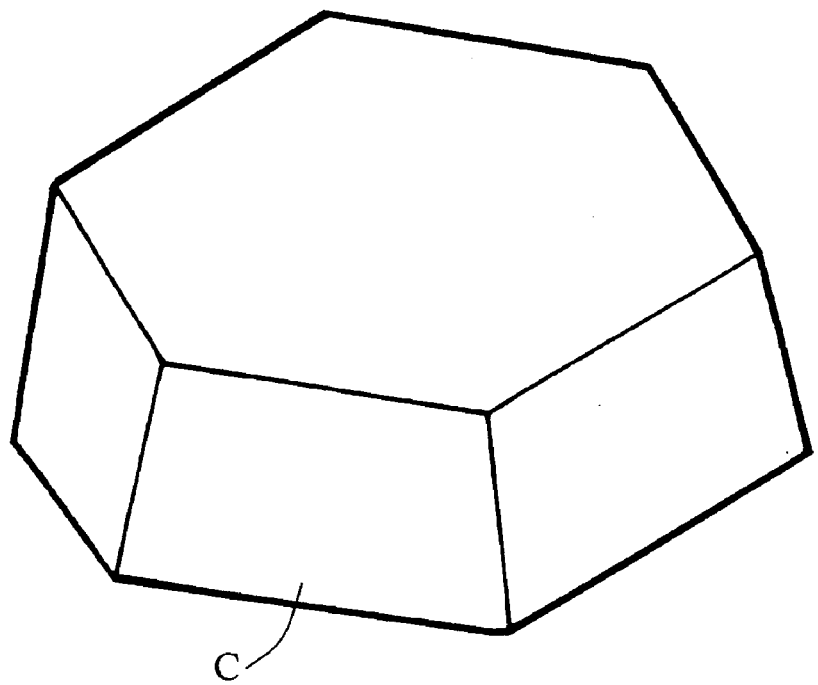

FIG. 35 is a perspective view of a device chip C of a hexagon mesa-shaped upper layer part B which is obtained by growing nitride semiconductor layers via a separation layer Q or directly on a defect position controlled substrate S having a hexagon network defect accumulating region H and low defect density regions Z/Y enclosed by the hexagon H and separating the upper layer part B by a mechanical or an optical method from the defect position controlled substrate S.

Figure 36:
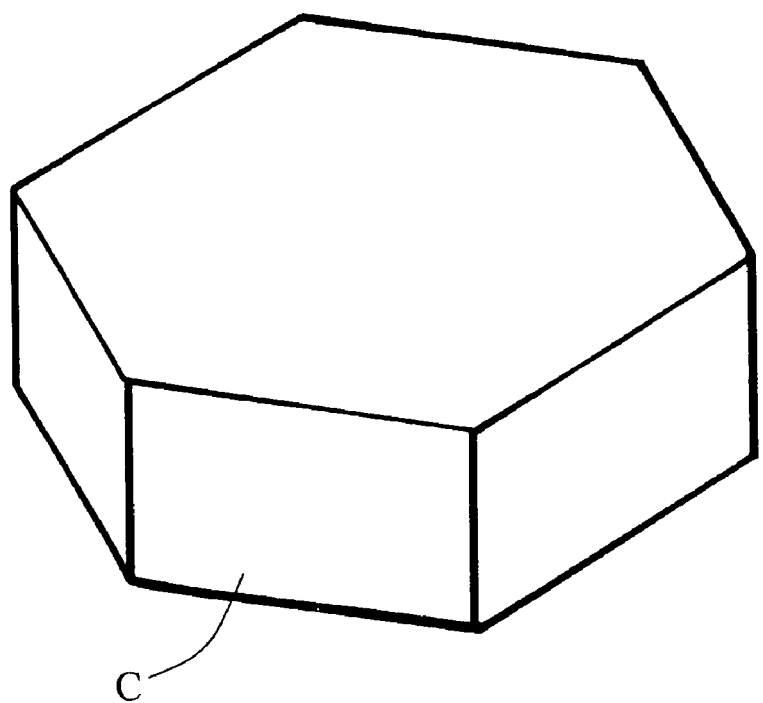

FIG. 36 is a perspective view of a hexagon device chip C with orthogonal ends and sides produced by polishing sides and ends of the mesa-shaped hexagon chip of FIG. 35.

Figure 37:
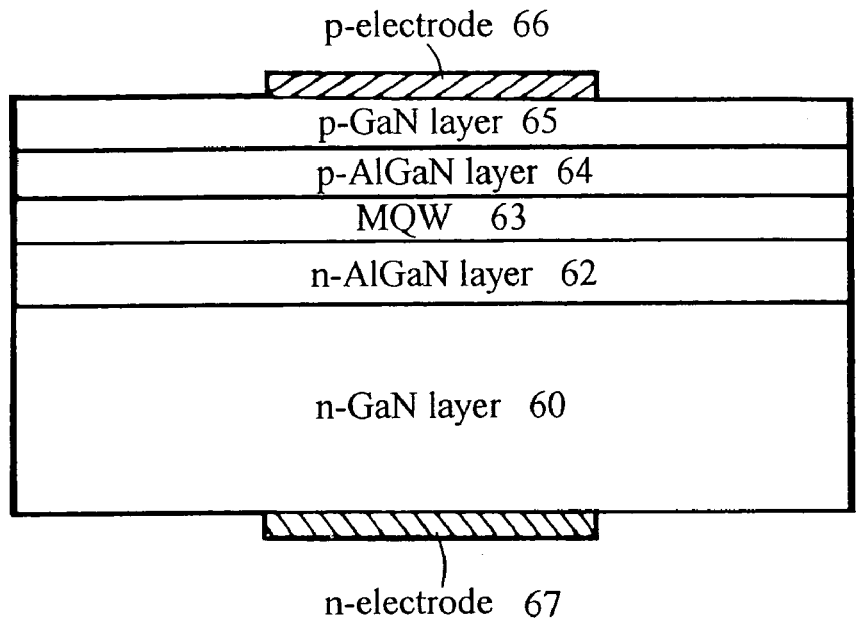

FIG. 37 is a sectional view of an LED chip of an upper layer part B with upper and lower electrodes which are obtained by separating the upper layer part B by a mechanical or an optical method from the defect position controlled substrates S on which LEDs are fabricated.

Figure 38:
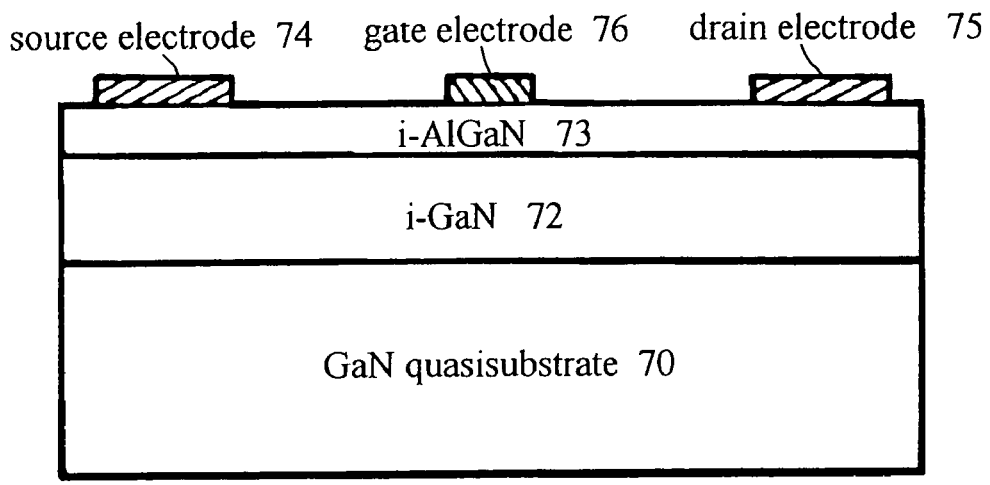

FIG. 38 is a sectional view of a HEMT chip of an upper layer part B with upper electrodes which is obtained by separating the upper layer part B by a mechanical or an optical method from the defect position controlled substrates S on which HEMTs are fabricated.

Figure 39:
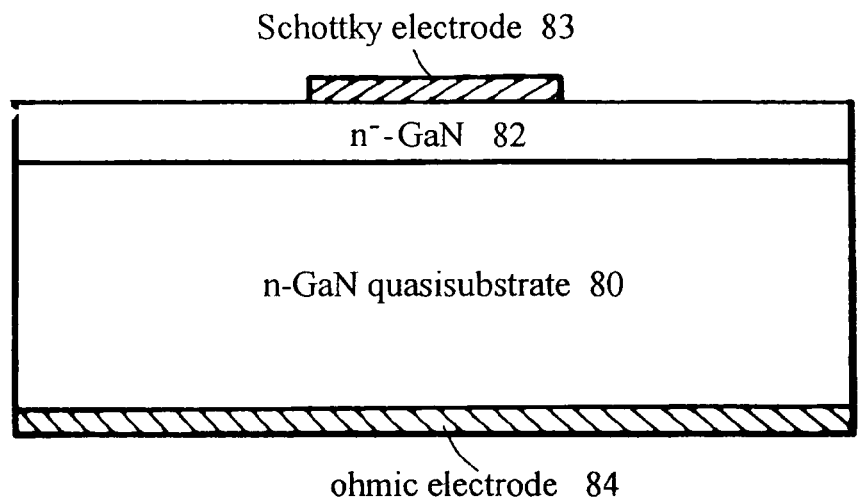

FIG. 39 is a sectional view of a Schottky diode chip of an upper layer part B with upper and lower electrodes which are obtained by separating the upper layer part B by a mechanical or an optical method from the defect position controlled substrates S on which Schottky diodes are fabricated.

Figure 40:
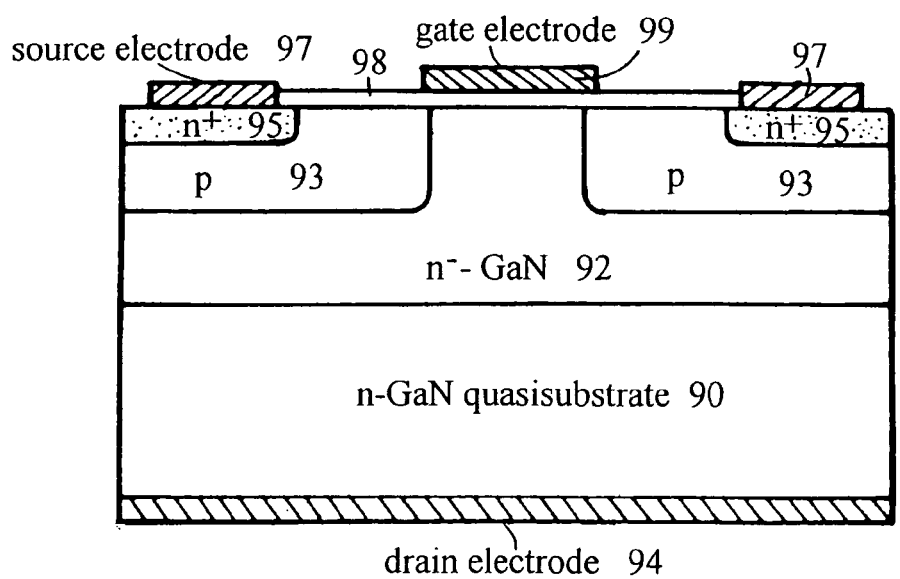

FIG. 40 is a sectional view of a vertical-type transistor chip of an upper layer part B with upper and lower electrodes which are obtained by separating the upper layer part B by a mechanical or an optical method from the defect position controlled substrates S on which vertical-type transistors are fabricated.

DESCRIPTION OF PREFERRED EMBODIMENT

[1. Defect Position Controlled Substrate S (FIGS. 16, 18, 19 and 20)]

A defect position controlled substrate S is a compound $Al_xIn_yGa_{1-x-y}N$ ($0 \leq x \leq 1$, $0 \leq y \leq 1$, $0 \leq x+y \leq 1$; abbr. AlIn- GaN). In the AlInGaN substrate S, the positions of the defect accumulating regions H and the low defect density regions ZY are predetermined. The GaN substrates having an inhomogeneous composition consisting of H, Z and Y have been first provided by ③ and ④. The crystal growth is slow on the mask M placed on the undersubstrate US, so that facet pits and facet grooves are produced on the mask M. Dislocations produced in the other regions are attracted to bottoms of the facet pits. As a result, the mask part having a high density of dislocation becomes a defect accumulating region H, and the other parts are low defect single crystal regions ZY.

The starting substrate of the present invention can be prepared by the teachings of ③ and ④. The starting substrate is an inhomogeneous wafer having Z, Y and H. The growing speed on Z,Y is different from the growing speed on H in nitride semiconductors. The growing speed of nitride semiconductor is fast on Z and Y, but slow on H. An inhomogeneous substrate causes differences in growing speeds. Furthermore the present invention makes closed loops H, which are novel. ③ (dot) and ④ (stripe) have no closed loop H. Neither ③ nor ④ discloses a substrate having a network defect accumulating region H, which is indispensable as a starting substrate in the present invention. ③ disclosing dot-type masks has defect accumulating regions H shown as isolated points. ④ disclosing stripe-type masks has defect accumulating regions H shown as parallel line groups. Both ③ and ④ have no closed loops.

The starting substrate of the present invention satisfies such conditions that the substrate should include the defect accumulating regions H and the low defect density regions ZY, and the defect accumulating regions H should form closed loops. A closed loop H encloses a ZY. The reason why the defect accumulating regions H should be closed loops is that dissociation along the closed loops H should instantly make individual device chips. The closed loop determines the shape of the unit of object devices. The inline of H shall be equal to a unit chip of the devices. The defect accumulating region H are required to make outlines of the object device chips. Repetitions of identical closed loops form a network. The present invention forms a closed loop network defect accumulating region H in undersubstrate S. The closed loops require the defect accumulating regions H to determine the shape of chips. The shape of a chip is identical to the shape of the inline of a closed loop. Since the defect accumulating regions H are borne on masks M, the shape of the masks M formed on an undersubstrate can determine the shape of the defect accumulating regions H.

In the defect position controlled substrate S, the defect accumulating regions H and the low defect density regions ZY have been grown in the vertical direction. The defect accumulating region H is a single crystal having an orientation inverse to the low defect density regions ZY. The inverse orientation is realized only in such case that the low defect density regions ZY grow with Ga-plane tops and N-plane bottoms and the defect accumulating regions H grow with N-plane tops and Ga-plane bottoms on an undersubstrate. The Ga-plane is (0001)(=C-plane). The N-plane is (000-1)(=-C-plane). Namely the low defect density regions ZY and the defect accumulating regions H are produced only when the GaN grows in the c-axis direction with facets. Thus the defect position controlled substrate S of the present invention has wide C-tops (0001) and narrow -C-tops (000-1).

Hexagonal system crystal has two important planes, M-planes {1-100} and A-planes {11-20} besides C-plane (0001). In many hexagonal nitride semiconductor crystals, M-plane {1-100} is a cleavage plane. It is still questionable whether the defect accumulating regions H and the low defect density regions ZY can be produced upon A-plane or M-plane or not. Large-sized {1-100} or {11-20} GaN wafers have never been produced yet. Experiments have been done neither on {1-100} wafer nor on {11-20} wafer. It is still unclear whether defect accumulating regions H and low defect density regions ZY, which have inverse orientations, would happen on masked {1-100} or {11-20} GaN wafers. It is unknown that the ZY and the H would have the selectivity of growth speed for further GaN growth thereon, assuming that inverse ZY and H would be produced on the masked {1-100} or {11-20} GaN wafers. The above-mentioned obstacles force the defect position controlled substrates S to restrict in the c-axis facet-growth crystal at present. Cleavage planes are not horizontal planes in the special substrate S. Cleavage planes are vertical to the surfaces of the inhomogeneous substrate S. Natural cleavage cannot divide nitride crystals grown on the substrate S in the vertical direction. Another separation means instead of cleavage shall be sought for dissociating crystals from the substrate S in the vertical direction.

Most of the nitride semiconductor crystals take a trigonal system or a hexagonal system. If outlines of device chips were harmonized with the cleavage planes, shapes of chips (closed loops) would be restricted to squares, regular hexagons, equilateral triangles, parallelograms and lozenges. If all the outlines of chips were equal to the cleavage planes, the shapes would be further restricted within regular hexagons, equilateral triangles, 120 degree parallelograms and lozenges. In the case, the defect accumulating regions H would be regular hexagons, equilateral triangles, 120 degree parallelograms or lozenges on the defect position controlled substrate S.

The present invention has no use for cleavage. The present invention divides chips by another means except cleavage. Thus the outlines of chips need not be harmonized with the cleavage planes. Square chips or rectangle chips are allowable. In the case, the defect accumulating regions H will be squares or rectangles. The maximum diameter of a mask unit of allowable squares, regular hexagons, equilateral triangles, parallelograms, lozenges or other closed loop polygons is 50 mm. The minimum diameter of a mask unit is 0.2 mm. The closed loops determine the shapes of device chips. The size and shape of the unit closed loop should be determined after the size and shape of object device chips. The diameter of the closed loop should be chosen to be equal to the diameter of object chips between 0.2 mm and 50 mm.

FIG. 15 is a plan view of an undersubstrate US provided with a square closed loop network mask M. A continual network masked part and isolated exposed parts appear on an undersubstrate US. FIG. 16 is a plan view of a freestanding AlInGaN wafer produced by growing an AlInGaN crystal with facets in vapor phase on an undersubstrate US to a sufficient thickness, polishing a rugged surface into a flat surface and eliminating the undersubstrate US. Defect accumulating regions H have been made upon the mask M. The defect accumulating region H forms a square repeating network. The parts enclosed by the closed loop H are the low defect density regions ZY of single crystals. This is a defect position controlled substrate S. Every low defect density region ZY will be served as a base for making a unit chip of object devices. Use of the substrate will produce square device chips. ZY and H are transparent. Human eye sight cannot discriminate H from ZY. Cathode luminescence (CL) and fluorescence microscope observation can discern H, Z and Y.

FIG. 17 is a plan view of an undersubstrate US provided with a regular hexagon closed loop network mask M. A continual network masked part and isolated exposed parts appear on an undersubstrate US. FIG. 16 is a plan view of a freestanding AlInGaN wafer produced by growing an AlInGaN crystal with facets in vapor phase on an undersubstrate US to a sufficient thickness, polishing a rugged surface into a flat surface and eliminating the undersubstrate US. Defect accumulating regions H have been made upon the mask M. The defect accumulating region H forms a regular hexagon repeating network. The parts enclosed by the closed loop H are the low defect density regions ZY of single crystals. This is another defect position controlled substrate S. Every low defect density region ZY will be served as a base for making a unit chip of object devices. Use of the substrate will produce hexagon device chips. ZY and H are transparent also in the substrate. Human eye sight cannot discriminate H from ZY. Cathode luminescence (CL) and fluorescence microscope observation can discern H, Z and Y.

Besides the substrate S having square and regular hexagons H, other unit-shape composing defect position controlled substrates S can be made and be used for making arbitrary polygon-shaped devices. FIG. 19 exhibits a triangle-unit-composing defect position controlled substrate S having a network defect accumulating region H and triangle low defect density regions ZY. The defect accumulating regions H have been made on the network mask M and the low defect density regions ZY are made on the exposed part on the undersubstrate US like the preceding examples shown in FIGS. 15-18. H corresponds to M one to one. A figure of a masked undersubstrate is omitted. In FIG. 19, the defect accumulating regions H shaped like equilateral triangles have closed loop lines. The low defect density single crystal regions ZY are surrounded by the defect accumulating regions H.

FIG. 20 exhibits a parallelogram-unit-composing defect position controlled substrate S having a network defect accumulating region H and parallelogram low defect density regions ZY enclosed by the network H.

A defect position controlled substrate S can be prepared by the methods proposed by ③ Japanese Patent Laying Open No. 2003-165799 and ④ Japanese Patent Laying Open No. 2003-183100. In addition to ③ and ④, the present invention adds a new requirement of closed loop formation of defect accumulating regions. Further the present invention makes the best use of a newly found property of the defect position controlled substrates S for facilitating the fabrication of device chips.

What is the property newly discovered? The property is that nitride semiconductor crystals are hardly grown upon defect accumulating regions H but are easily grown upon low defect density regions ZY (abbr. of Z and Y). The property was not found at the time of ③ and ④ invented by the Inventors. Then the Inventors had no exact understanding of natures of the defect accumulating regions H. At present some properties of the defect accumulating regions H have been clarified.

Single crystal wafers having three fold rotation symmetry are used as undersubstrates. Nitride semiconductor crystal grown on the undersubstrate has a C-plane surface, since the C-plane has three fold symmetry. However, since the facet growth method produces and maintains facets, C-planes are not prevalent throughout growth, even so an average direction of growth is the c-axis direction. When the growth is ended, the surface of the crystal is rugged and facetted. Polishing the rugged, facetted surface makes a flat surface of the GaN crystal. The flat surface would be C-planes, since the undersubstrate has three-fold symmetry. It was known that the low defect density regions ZY took C-plane (Ga-surface) tops and -C-plane bottoms (N-surface).

The facts coincided with what the Inventors had foreseen. It was found that the defect accumulating regions H had not C-plane tops and was single crystals. Being single crystals, the defect accumulating regions H have an orientation inverse to the low defect density regions ZY. It was a surprising discovery. The defect accumulating regions H were discovered to be single crystals of inverse orientation. The tops of the defect accumulating regions H are N-surfaces. The bottoms of the defect accumulating regions H are Ga-surfaces. The abovementioned defect position controlled substrate S is a mosaic of the low defect density regions ZY of Ga-tops and the defect accumulating regions H of N-tops. The bottom surface of the substrate is reverse. The bottom surface is another mosaic of the N-surfaced low defect density regions ZY and the Ga-surfaced defect accumulating regions H.

These facts were yet insufficient for the inventors to build up the present invention. Later another fact should that nitride semiconductors hardly grow on the (N-surfaces) defect accumulating regions H but easily grow on the (Ga-surfaces) low defect density regions ZY. The discovery of the growing speed selectivity was a great novel. Growing speed selectivity of ZY to H enables the facet growth method to establish the present invention grounded on the concept of the defect position controlled substrate S. As described before, when GaN is grown on an undersubstrate (GaAs, sapphire or SiC) with masks ($SiO_2$, SiN, W or Pt), GaN scarcely grows on the masks but easily grows on the exposed parts of the undersubstrate. This is because speed preference of undersubstrates to masks. The undersubstrate/mask speed preference allows masks to form facets starting from edges of masks. This is the undersubstrate/mask preference.

The ZY/H speed selectivity is different from the undersubstrate/mask preference. Don't confuse the ZY/H speed selectivity with the undersubstrate/mask preference. What establishes the present invention is the ZY/H speed selectivity that AlInGaN nitride semiconductors hardly grow on the defect accumulating regions H and easily grow on the low defect density regions ZY. The discovery of the ZY/H speed selectivity is innovative. A substrate mosaic of ZY+H inherits an exposed/masked undersubstrate. A contrivance of the defect position controlling substrates S is novel.

Growth on the defect accumulating regions H is now named "on-H growth". Growth on low defect density regions ZY is named "on-ZY growth". The present invention makes the best use of selectivity of growing speeds between the on-H growth and the on-ZY growth on the defect position controlled substrate S. The growing speed of the on-H growth is denoted by $V_H$. The growing speed of the on-ZY growth is denoted by $V_{ZY}$. The selectivity here means $V_H<V_{ZY}$. This selectivity is important for the present invention.

The present invention grows upper layer parts B either via a separation layer Q or directly upon a defect position controlled substrate S. Namely the present invention allows both a BQS type and a BS type.

When nitride crystals are directly grown on a substrate S without Q, upper layer parts B grow selectively only upon low defect density regions ZY, leaving defect accumulating regions H exposed. When nitride crystals are grown via a separation layer Q on a substrate S, upper layer parts B scarcely grow on defect accumulating regions H but grow only upon low defect density regions ZY. The fact means that the upper layer parts B inherit the growth speed selectivity ($V_H<V_{ZY}$) of the defect position controlled substrate S. The inheritance is caused not by a high defect density in the defect accumulating regions H, but by the orientation inversion of the defect accumulating regions H. Separation layers Q or upper layer parts B growing on N-surfaces of the defect accumulating regions H should have N-surfaces. "Epitaxial" growth means such succession of the orientation. N-surfaces and Ga-surfaces have the growing speed selectivity. The orientation is conserved between a substrate and upper growing layers. When the number and the thickness of the upper layers are increased, the property of N-surface layers growing upon N-surfaces of the substrate shall be conserved as an invariant property.

In ideal growth, upper layers are piled only upon low defect density regions ZY, leaving defect accumulating regions H unoccupied. Even if few grains are laid upon the defect accumulating regions H, the grains will be fully eliminated by etching with KOH (potassium hydroxide). The boundary grooves are revealed on the defect accumulating regions H by the removal of grains.

Irradiation of a laser beam or mechanical bombardment is applied to the grown crystal BQS or BS. Upper layer parts B are separated from the substrate S by the laser beam irradiation (photoseparation) or the mechanical shock(mechanical separation). The process means double separations including both vertical separation between the upper layer parts B and the substrate S and horizontal separation between the neighboring upper layer parts B. The separated upper layer parts B are now called "device chips C". The chip separation is unique and simple. The chip separation dispenses with wafer (substrate) division. The chip has no substrate. The chip is composed of thin layers. The thickness of a chip is 10 µm to 600 µm. Preferably the chip has a thickness of 10 µm to 300 µm. The defect position controlled substrate (wafer) can be used again and again. The present invention makes use of the growing speed selectivity ($V_H < V_{ZY}$) between H and ZY.

The present invention employs AlInGaN defect position controlled substrates S, which are exhibited, for example, in FIGS. 16, 18, 19 and 20, as a starting substrate.

[2. Separation Layer Q (FIG. 21)]

Separation layers Q are optional. Separation layers Q are useful. However the present invention can dispense with separation layers Q. The separation layers Q are interposed between the defect position controlled substrate S and the upper layer parts B. The thin separation layers Q momentarily evaporate, disappear or collapse due to the dissociation of the upper layer parts B. The separation layers Q have the selectivity of difficult growth on the defect accumulating regions H and easy growth on the low defect density regions ZY. FIG. 21 exhibits a section of a defect position controlled substrate S and separation layers Q grown on the substrate S. Separation layers affluently grow upon low defect density regions (Al-InGa-surface, Ga-surface in short) but scarcely grow upon defect accumulating regions H (N-surface). N-surfaces of the defect accumulating regions H are immune from separation layers Q. Isolated separation layers Q lie only upon the Ga-surfaces of the low defect density in FIG. 21. The selectivity enables the separation layers Q to pile only the Ga-surfaces of ZY. Sufficiently thin separation layers Q are desirable for the sake of alleviation of growing time and materials.

The separation layers Q have a thickness of 3 nm to 1000 nm. An over-1000 nm separation layer Q is available, but an excess thickness is a waste of materials. A thickness of less than 3 nm does not absorb laser power enough to heat and evaporate the separation layers Q. The necessity of the separation layer Q is contingent upon the vertical division means W. Some vertical division means requires no separation layer Q. Photoseparation by a laser beam shot requires the following inequalities for the bandgap Egq of the separation layer Q, the bandgap Egs of the substrate S, bandgaps {Ebj} of the upper layers {Bj}, the minimum bandgap Egb of {Ebj} and laser wavelength λ, $$Egq < hc/\lambda < Egs, \ Egq < hc/\lambda < Egb.$$

A semiconductor cannot absorb the light having energy lower than the bandgap Eg but can absorb the light having energy higher than the bandgap Eg. FIG. 28 denotes a substrate S, a separation layer Q and upper layer parts B and further shows a change of bandgaps Eg for showing the selective absorption of a separation layer. Energy of light is represented by $hc/\lambda = h\nu$, where h is the Plank constant, c is the vacuum light speed, $\nu$ is a frequency of light and λ is a wavelength. $\nu = c/\lambda$. The bandgap Egq of the separation layer Q is smaller than $h\nu = hc/\lambda$ (Egq<hc/λ). Bandgaps {Ebj} of upper layers {Bj} are all larger than $h\nu = hc/\lambda$ (hc/λ<{Ebj}). The laser light satisfying the inequalities passes the upper layers B and the substrate S without loss, but is fully absorbed by the separation layer Q. Since the separation layer Q is rapidly heated and dissolved, the upper parts B are separated from the defect position controlled substrate S by the separation layer Q as a cut surface.

The best candidate satisfying the inequalities for the separation layer Q is, for example, an InN layer. An InN layer is applicable to all the sets of upper layer (AlInGaN) parts B and substrates (AlInGaN) S. InN has the lowest bandgap in the nitride semiconductors briefly represented by AlInGaN. InN crystals have had poor applications and poor supply because of the difficulty of producing a good InN crystal. Nobody has known an exact value of the bandgap of InN for a long time. Somebody believed that InN bandgap was 2 eV. Another alleged that the bandgap of InN was 1.7 eV. At present, the bandgap of InN is figured to be 0.7 eV, but is still disputable. The bandgap of InN is lower than that of GaN and AlN. The InN bandgap is the lowest among AlInGaN mixtures. Besides InN, anyone of AlInGaN having lower bandgaps than inner layers and substrates can be a candidate of the separation layer for photoseparation.

In the case of mechanical separation, separation layers Q should be made of mechanically fragile materials. For example, the separation layer Q is a GaN film doped with C (carbon), Fe (iron) or Mg (magnesium). Doping of C, Fe or Mg adds fragility to GaN. Shear stress or tensile stress is applied between the upper layer parts B and the substrate S by a mechanical bombardment. The separation layer Q collapses. The upper layer parts B are detached from the substrate S. The upper layer parts B become isolated chips C.

[3. Upper Layer Parts B (FIG. 22)]

Upper layer parts B are epitaxially grown on the separation layers Q. The upper layer parts B are collectively piled layers with a variety of nitride semiconductors. The upper layers B have the selectivity to the inhomogeneous substrate S. Upper layers B scarcely grow on the defect accumulating regions H but affluently grow on the low defect density regions ZY. Mesa-shaped upper layer parts B are formed only upon the low defect density regions ZY via Q as demonstrated in FIG. 22. FIG. 22 shows devices without upper electrodes. Otherwise upper electrodes can be made in the wafer process. Wide gaps above the defect accumulating regions H are boundaries between neighboring upper layers (device chip units). The wide boundaries are naturally born by the defect accumulating regions H. The wide gap boundaries are useful for momentary chip division. This is an advantage of the defect position controlled substrate S. One mesa B on Q corresponds to one device chip. An upper layer part B will be a chip of the object devices. The layer structure, shape and size of an upper layer part B are identical to the layer structure, shape and size of a chip of the object devices. As mentioned before, the diameter should range between 0.2 mm and 50 mm. The height of the upper layers part B shall be 10 μm to 600 μm. Unlike conventional device chips, the chips made by the present invention lack substrates. The elimination of the substrate enables the present invention to reduce the thickness of a chip. The chip made by the present invention has a quasisubstrate instead of a substrate.

AlInGaN wafers made by the present invention extend their applications to substrate wafers for producing light emitting devices, e.g., light emitting diodes (LEDs) and laser diodes (LDs), rectifiers, bipolar transistors, field effect transistors (FETs), high electron mobility transistors (HEMTs), thermo-sensors, pressure sensors, radioactive-ray sensors, visible/ultraviolet ray sensors, surface acoustic wave devices (SAWs), vibrators, resonators, oscillators, micro-electro-mechanical systems (MEMSs), piezoelectric actuators and so on. The structures of upper layers parts B depend upon the object devices. The upper layer parts B should be identical to upper structures corresponding to conventional devices. A conventional device chip minus substrate is equal to an upper layer part B. A variety of upper layers B are possible in the present invention.

A light emitting device comprises a quasisubstrate, a buffer layer, a cladding layer, an active layer, another cladding layer and a contact layer in the present invention. Here "quasisubstrate", which is a novel concept, is not a conventional thick substrate. The quasisubstrate is not a part of the starting defect position controlled substrate S. The defect position controlling substrate S is withdrawn without loss and is used for making upper layers thereon again and again. The quasisubstrate is a part of the upper layers B. FIGS. 37-40 exhibit complete device chips including n-GaN quasisubstrates 60, 70,80 and 90, which are parts of the upper layers B. The upper layer part B is equal to a complete chip minus bottom electrode or a complete chip minus bottom/top electrodes in the figures.

A photodiode comprises a quasisubstrate, a buffer layer, a light receiving layer, a window layer and a contact layer. A Schottky diode contains a quasisubstrate and an n-type layer. A HEMT includes a quasisubstrate, an i-layer and an i-layer. After the upper layer parts B are dissociated from the substrate S, at least bottom electrodes which are either n-electrodes or p-electrodes, are formed on the bottoms of the isolated upper layer parts (chips) B. Concrete structures of upper layer parts B are described for a variety of devices.

(Upper Layers for an LED (Light Emitting Diode; FIG. 37)

FIG. 37 shows a structure of upper layers B for making an LED from top to bottom.

| | |
|---|---|
| p-GaN layer | 65 |
| p-AlGaN layer | 64 |
| GaN/InGaN-MQW (GaN/InGaN)$_3$ | 63 |
| n-AlGaN layer | 62 |
| n-GaN quasisubstrate | 60 |

The n-GaN quasisubstrate 60 is the aforementioned quasisubstrate, which is not a part of the substrate S but a component of the upper growth layers B. The MQW (multi-quantum well) (GaN/InGaN)$_3$ is composed of three piling sets of GaN and InGaN layers.

(Upper Layers for a HEMT (High Electron Mobility Transistor; FIG. 38)

FIG. 38 shows an upper layer structure B for a HEMT from top to bottom.

| | |
|---|---|
| i-AlGaN layer | 73 |
| i-GaN layer | 72 |
| GaN quasisubstrate | 70 |

The GaN quasisubstrate 70 is not a part of the substrate S but a component of the upper growth layers.

(Upper Layers for a Schottky Diode: FIG. 39)

FIG. 39 shows upper layers B for a Schottky diode from top to bottom.

| | |
|---|---|
| n$^-$-GaN layer | 82 |
| n-GaN quasisubstrate | 80 |

The n-GaN quasisubstrate 80 is not a part of the substrate S but a component of the upper growth layers.

(Upper Layers for a Vertical MIS Transistor; FIG. 40)

FIG. 40 shows upper layers for a vertical MIS transistor from top to bottom

| | |
|---|---|
| n$^+$-GaN layer | 95 |
| p-GaN layer | 93 |
| n$^-$-GaN layer | 92 |
| n-GaN quasisubstrate | 90 |

The n-GaN quasisubstrate 90 is not a part of the substrate S but a component of the upper growth layers.

[4. Upper Layer Parts B+Electrode E (FIG. 26)]

An upper layer part B is a pile of films epitaxially grown directly or via a separation layer Q upon a substrate S as exhibited in FIG. 26. Sometimes the wafer process produces upper electrodes P on tops of the upper layer parts B before the separation of the upper layer parts B from the substrate S. When the device has an n-type quasisubstrate, the upper electrodes will be p-electrodes in many cases. In another case, some device allows a top p-electrode and a top n-electrode. In the top n-/p-electrode devices, the process of electrode formation can be included in the wafer process as well as the conventional device fabrication. An upper layer part B for a light emitting device (LED, LD) is composed of a quasisubstrate, a buffer layer, a cladding layer, an active layer, another cladding layer, a contact layer and an electrode. Another upper layer part B for a photodiode (PD) is composed of a quasisubstrate, a buffer layer, a light receiving layer, a window layer, a contact layer and an electrode. Another upper layer part B for a Schottky diode is made of a quasisubstrate, an n-type layer and a Schottky electrode. Another upper layer part B for a HEMT (high electron mobility transistor) is made of a quasisubstrate, an i-type layer, another i-type layer and electrodes. Bottom electrodes are made upon revealed bottoms of the chips (upper layer parts B) separated from the defect position controlled substrate S.

(Upper Layers and Electrodes for an LED: FIG. 37)

FIG. 37 shows a structure of upper layers and electrodes for an LED from top to bottom.

| | |
|---|---|
| p-electrode (Ni) | 66 |
| p-GaN layer | 65 |
| p-AlGaN layer | 64 |
| GaN/InGaN-MQW (GaN/InGaN)$_3$ | 63 |
| n-AlGaN layer | 62 |
| n-GaN quasisubstrate | 60 |

The MQW (GaN/InGaN)$_3$ is composed of three piling sets of GaN and InGaN layers.

(Upper Layers and Electrodes for a HEMT: FIG. 38))

FIG. 38 shows upper layers and electrodes for a HEMT from top to bottom.

Source electrode 74, Drain electrode (Ti/Al/Ti/Au) 75, Gate electrode (Au) 76

| | |
|---|---|
| i-AlGaN layer | 73 |
| i-GaN layer | 72 |
| GaN quasisubstrate | 70 |

(Upper Layers and Electrodes for a Schottky Diode: FIG. 39)

FIG. 39 shows upper layers B and electrodes for a Schottky diode from top to bottom.

| | |
|---|---|
| Schottky electrode (Au) | 83 |
| n⁻-GaN layer | 82 |
| n-GaN quasisubstrate | 80 |

(Upper Layers and Electrodes for a Vertical MIS Transistor; FIG. 40)

FIG. 40 shows upper layers B and electrodes a vertical MIS transistor including layers/electrodes from top to bottom

| | |
|---|---|
| Source electrode (Ti/Al/Ti/Au) | 97 |
| Gate electrode (Au) | 99 |
| n⁺-GaN layer | 95 |
| p-GaN layer | 93 |
| n⁻-GaN layer | 92 |
| n-GaN quasisubstrate | 90 |

[5. Separating Method in Vertical/Horizontal Directions]

Then the upper layer parts B shall be detached in a vertical direction from the defect position controlled substrate S. Detached upper layer parts B become chips C. The chip C lacks a substrate. FIGS. 23 and 27 demonstrate vertical separation of the upper layer parts B from the substrate S. Break of the separation layer Q detaches the upper layer parts B from the substrate S momentarily. Separation methods are described. Each upper layer part B is almost predivided from neighboring upper layer parts B in horizontal directions by the defect accumulating regions H as boundaries. Thus the present invention separates the upper layer parts B simultaneously in the vertical/horizontal directions from S and B. Chip-separation means is a vertical/horizontal separation means. Chip-separation is done by a laser beam shot and a mechanical bombardment. Both will be described. Two ways are available. One is relied upon a separation layer Q. The other dispenses with a separation layer. Both will be clarified.

(5A. Laser Irradiation Division with Separation Layer Q)

Separation layers Q are interposed between the upper layer parts B and the defect position controlled substrate S. High power laser irradiation can selectively dissolve the separation layer Q for dividing the upper layer part B from the substrate S. The separation layer Q has a thickness of 3 nm to 1000 nm. A under-3 nm separation layer would be inactive. An over-1000 nm separation layer is active but costs too much. The separation layer Q has the convenient selectivity of difficult on-H growth and easy on-ZY growth as well as the upper layers. The separation layer Q hardly grows on the defect accumulating region H but easily grows on the low defect density regions ZY. The separating layers Q and upper layer parts B are selectively formed on the low defect density regions ZY. The defect accumulating region H is nearly immune from Q and B. Since the separation layer Q should selectively dissolved by a beam shot from a high power laser, the bandgap Egq of the separation layer Q must be smaller than any bandgap of the upper layers {Bj}. The energy hc/λ of the laser beam must be higher than the separation layer bandgap Egq but lower than any bandgap of upper layers. Here h is the Plank's constant and c is the vacuum light velocity. The bandgap of the defect position controlled substrate S is denoted by Egs. The bandgap of the j-th layer Bj in the upper layer parts B is denoted by Egj. The conditions imposed upon the laser wavelength λ, the separation layers Q, the upper layer parts B and the defect position controlled substrate S are Egq<hc/λ<Egs and Egq<hc/λ<min{Egj}. Here min{Egj} means the minimum of {Egj}.

Semiconductors and insulators allow light of energy hc/λ less than the bandgap Eg to pass through but absorb light of energy hc/λ higher than the bandgap Eg. If hc/λ>Eg, the light induces electron/hole bandgap transition and loses energy. The light (hc/λ>Eg) is absorbed. If hc/λ<Eg, the light induces no electron/hole bandgap transition and does not lose energy. The light (hc/λ<Eg) passes through without absorption. FIG. 28 demonstrates the substrate S, the separation layer Q, upper layers B and vertical variations of bandgaps Eg for S, Q and B. The energy of laser light is denoted by hv, where h is the Plank constant and v is frequency of the light (v=c/λ). The vertical line hv denoting laser energy is lower than the bandgaps {Egb} of the upper layers and the bandgap Egs of the substrate S but higher than the bandgap Egq of the separation layer Q. Egq<hv<Egs and Egq<hv<min{Egj} are satisfied. If high power laser shoots a top of a specimen containing B, Q and S via B, the laser beam passes the upper layers B without loss and attains to the separation layer Q. If high power laser shoots a bottom of a specimen containing B, Q and S via B, the laser beam passes the substrate S without loss and attains to the separation layer Q. The separation layer Q absorbs the laser light exclusively. The separation layer Q heats, thermo-dissolves, evaporates and disappear. The upper layer parts B are detached in the vertical and horizontal directions from S and other B instantly. For example, an InN (indium nitride) film can be assigned to a separation layer Q. InN has the lowest bandgap in all the nitride semiconductors represented by $Al_xIn_yGa_{1-x-y}N$. The lowest bandgap-carrying InN separation layer will selectively absorb the laser beam and rapidly dissolve. Other AlInGaN having a large In ratio is available for a separation layer. The defect accumulating regions H have poor, lean, thin upper layers or no upper layers on tops. When the upper layer parts B are detached from the substrate S, the upper layer parts B are separated from each other at the network H as boundaries. Separated upper layer parts B become chips C. Sometimes the remnants Q' of the separation layer Q remain on the defect position controlling substrate S (FIG. 27). Polishing or etching can eliminate the remnants Q' from the substrate S. Cleaned flat smooth defect position controlled substrate S is allotted for reuse. Defect position controlled substrates S are repeatedly reused as a starting substrate.

(5B. Mechanical Bombardment Division with Separation Layer Q)

Separation layers Q are interposed between the upper layer parts B and the defect position controlled substrate S. The separation layer Q has a thickness of 3 nm to 1000 nm. The separation layer of a thickness less than 3 nm would be inactive. The separation layer of a thickness more than 1000 nm is active but costs money. A mechanical means applies a bombardment to the grown crystal for selectively breaking/dissolving the separation layer Q and dividing the upper layer parts B from the substrate S. Fragility is required of separation layers Q, since the separation layer Q should be exclusively broken by a bombardment with other components intact. For example, GaN films doped with carbon (C), magnesium (Mg) or iron (Fe) are candidates for fragile separation layers Q. Lift-off of upper layer parts B from a fixed substrate S breaks the fragile separation layers Q, releases the upper layer parts B from the substrate S and makes individual chips C.

(5C. Laser Irradiation Division without Separation Layer)

Without the help of separation layers Q, upper layer parts B can be vertically detached from a defect position controlled substrate S. In the case, the upper layer parts B are directly piled upon the defect position controlled substrate S. A mechanical means is inapplicable, since the grown specimen has no fragile film which would break by a bombardment. Photoseparation by a laser shot is applicable. In the case, when a laser beam shoots a specimen, a part, which has the minimum bandgap, of the upper layers absorbs laser light, heats up, thermo-dissolves and evaporates in order to detach the upper layers B from the substrate S. The minimum of the bandgaps Egb=min{Egj} of the upper layers B, other bandgaps {Egj'}, and the bandgap Egs of the substrate S should satisfy inequalities min{Egj}<hc/λ<Egs and hc/λ<{Egj'}.

[6. Formation of Top Electrodes (FIG. 24)]

Upper layer parts B are separated from a substrate S and are divided into chips C (FIG. 23). Then top electrodes P are produced on bottoms of the separated device chip (upper layer parts B) chip by chip out of the wafer process. A chip having upper electrodes P is made as shown in FIG. 24. Instead of the post-separation formation, upper electrodes P can otherwise be fabricated on tops of the upper layer parts B on the substrate in the wafer process (pre-separation formation), as exhibited in FIGS. 26 and 27. This case of course requires no formation of upper electrodes P after the separation of device chips.

[7. Formation of Bottom Electrodes (FIG. 25)]

Then bottom electrodes R are produced on bottoms of separated device chips (upper layer parts B) chip by chip out of the wafer process. It is a defect of the present invention that the wafer process cannot make bottom electrodes R. The bottom electrodes R shall be made in chip-processing. However, some chips require no bottom electrode as shown in FIG. 38.

[8. Reshaping of Chips (FIG. 29-FIG. 36)]

In many cases, upper layer parts B outlined by closed loop defect accumulating regions H are grown in a mesa-shape. Sometimes mesa-shaped chips are available for device chips. However, when rectangle chips having the same sized top and bottom are required, ends and sides (or four sides) of the mesa chips should be polished to be orthogonal to the top and bottom chip by chip.

FIG. 29 denotes a mesa-shaped square chip C, which is just separated from the defect position controlled substrate S as an upper layer part B, having a square bottom and a square top. When a mesa chip is allowable, the mesa square chip shall be mounted upon a package. Otherwise, ends and sides are polished into planes orthogonal to the top/bottom for reshaping the mesa into a non-mesa square chip as shown in FIG. 30.

FIG. 31 denotes a mesa-shaped equilateral triangle chip C, which is just separated from the defect position controlled substrate S. The mesa-shaped triangle chip is sometimes available. Otherwise, the mesa shall be reshaped into an erect triangle chip (FIG. 32) by polishing sides (and ends) into planes orthogonal to the top.

FIG. 33 denotes a mesa-shaped parallelogram chip, which is just separated from the defect position controlled substrate S. The mesa-shaped parallelogram chip can sometimes be mounted on a package. Otherwise, the mesa shall be reshaped into a vertical parallelogram chip (FIG. 34) by polishing sides (and ends) into planes orthogonal to the top.

FIG. 35 denotes a mesa-shaped hexagon chip, which is just separated from the defect position controlled substrate S. The mesa-shaped hexagon chip can sometimes be mounted on a package. Otherwise, the mesa shall be reshaped into a vertical hexagon chip (FIG. 36) by polishing sides into planes orthogonal to the top.

[9. Final Layer Structure of Device Chips Having a GaN Substrate; FIG. 37-FIG. 40]

Mesa-shaped chips are also available. Here electrode-carrying erect chips having sides orthogonal to the top are demonstrated in FIG. 37 to FIG. 40. The device chip, which is a separated upper layer part B, includes no defect position controlled substrate S. Thicknesses of the upper layer parts B are 10 μm to 600 μm, which is thin in comparison with conventional chips. Conventional device chips include a thick substrate. Since the substrate is thick, conventional chips have thicknesses of 300 μm to 600 μm. However, the chips of the present invention, which lack a substrate, can reduce the thickness to 10 μm to 300 μm. Small thickness is effective in prompting heat radiation and photo-sensitivity.

(Application to LED (Light Emitting Diode; FIG. 37)

FIG. 37 shows an application to an LED including layers/electrodes from top to bottom.

| | |
|---|---|
| p-electrode (Ni) | 66 |
| p-GaN layer | 65 |
| p-AlGaN layer | 64 |
| GaN/InGaN-MQW (GaN/InGaN)$_3$ | 63 |
| n-AlGaN layer | 62 |
| n-GaN substrate | 60 |
| n-electrode (Ti/Al/Ti/Au) | 67 |

(Application to HEMT (High Electron Mobility Transistor; FIG. 38)

FIG. 38 shows an application to a HEMT including layers/electrodes from top to bottom. Source electrode 74, Drain electrode (Ti/Al/Ti/Au) 75, Gate electrode (Au) 76

| | |
|---|---|
| i-AlGaN layer | 73 |
| i-GaN layer | 72 |
| GaN substrate | 70 |

(Application to Schottky Diode: FIG. 39)

FIG. 39 shows an application to a Schottky diode including layers/electrodes from top to bottom.

| | |
|---|---|
| Schottky electrode (Au) | 83 |
| n⁻-GaN layer | 82 |
| n-GaN substrate | 80 |
| ohmic electrode (n-electrode; Ti/Al/Ti/Au) | 84 |

(Application to Vertical MIS Transistor; FIG. 40)

FIG. 40 shows an application to a vertical MIS transistor including layers/electrodes from top to bottom

| | |
|---|---|
| Source electrode (Ti/Al/Ti/Au) | 97 |
| Gate electrode (Al) | 99 |
| n⁺-GaN layer | 95 |
| p-GaN layer | 93 |
| n⁻-GaN layer | 92 |
| n-GaN substrate | 90 |
| Drain electrode (Ti/Al/Ti/Au) | 94 |

What is claimed is:

1. A method of producing nitride semiconductor devices comprising the steps of: preparing an $Al_xIn_yGa_{1-x-y}N$ ($0 \leq x \leq 1$; $0 \leq y \leq 1$; $0 \leq x+y \leq 1$) defect position controlled substrate S including a closed loop network defect accumulating region H and low defect density regions ZY enclosed by the closed loop network defect accumulating region H, growing epitaxially $Al_{uj}In_{vj}Ga_{1-uj-vj}N$ ($0 \leq uj \leq 1$; $0 \leq vj \leq 1$; $0 \leq uj+vj \leq 1$) upper layers selectively on the low defect density regions ZY, forming upper layer parts B on the low defect density regions ZY, dissolving bottom parts of the upper layer parts B, separating the upper layer parts B as device chips C from the defect position controlled substrate S in a vertical direction, simultaneously separating the upper layer parts B from each other in horizontal directions, and reusing the defect position controlled substrate S as a substrate for a next production.

2. A method of producing nitride semiconductor devices comprising the steps of: preparing an $Al_xIn_yGa_{1-x-y}N$ ($0 \leq x \leq 1$; $0 \leq y \leq 1$; $0 \leq x+y \leq 1$) defect position controlled substrate S including a closed loop network defect accumulating region H and low defect density regions ZY enclosed by the closed loop network defect accumulating region H, forming a nitride separation layer Q having a narrow bandgap Egq selectively on the low defect density regions ZY of the defect position controlled substrate S, growing epitaxially $Al_{uj}In_{vj}Ga_{1-uj-vj}N$ ($0 \leq uj \leq 1$; $0 \leq vj \leq 1$; $0 \leq uj+vj \leq 1$) upper layers having a j-th component of a bandgap {Egj} selectively on the separation layer Q, forming upper layer parts B via the separation layer Q on the low defect density regions ZY, dissolving the separation layer Q by irradiation of a laser beam with energy hc/λ which is higher than the bandgap Egq of the separation layer Q but is lower than a substrate bandgap Egs and is lower than the minimum Egb (=min{Egj}) of the bandgaps {Egj} of the upper layer parts B (Egq<hc/λ<Egb, Egs), where h is Plank's constant, c is the vacuum light velocity and λ is a wavelength of the laser beam, separating the upper layer parts B as device chips C from the defect position controlled substrate S in a vertical direction, simultaneously separating the upper layer parts B from each other in horizontal directions, and reusing the defect position controlled substrate S as a substrate for a next production.

3. A method of producing nitride semiconductor devices comprising the steps of: preparing an $Al_xIn_yGa_{1-x-y}N$ ($0 \leq x \leq 1$; $0 \leq y \leq 1$; $0 \leq x+y \leq 1$) defect position controlled substrate S including a closed loop network defect accumulating region H and low defect density regions ZY enclosed by the closed loop network defect accumulating region H, forming a fragile nitride separation layer Q selectively on the low defect density regions ZY of the defect position controlled substrate S, growing epitaxially $Al_{uj}In_{vj}Ga_{1-uj-vj}N$ ($0 \leq uj \leq 1$; $0 \leq vj \leq 1$; $0 \leq uj+vj \leq 1$) upper layers selectively on the separation layer Q, forming upper layer parts B via the separation layer Q on the low defect density regions ZY, breaking the separation layer Q by applying mechanical stress to the separation layer Q by mechanical means, separating the upper layer parts B as device chips C from the defect position controlled substrate S in a vertical direction, simultaneously separating the upper layer parts B from each other in horizontal directions, and reusing the defect position controlled substrate S as a substrate for a next production.

4. A method of producing nitride semiconductor devices comprising the steps of: preparing an $Al_xIn_yGa_{1-x-y}N$ ($0 \leq x \leq 1$; $0 \leq y \leq 1$; $0 \leq x+y \leq 1$) defect position controlled substrate S including a closed loop network defect accumulating region H and low defect density regions ZY enclosed by the closed loop network defect accumulating region H, growing epitaxially $Al_{uj}In_{vj}Ga_{1-uj-vj}N$ ($0 \leq uj \leq 1$; $0 \leq vj \leq 1$; $0 \leq uj+vj \leq 1$) upper layers having a j-th component of a bandgap {Egj} selectively on the low defect density regions ZY of the defect position controlled substrate S, forming upper layer parts B on the low defect density regions ZY, dissolving a part of the upper layer parts B with the lowest bandgap (min{Egj}) by irradiation of a laser beam with energy hc/λ which is higher than the minimum Egb (=min{Egj}) of the bandgaps {Egj} of the upper layer parts B but is lower than a substrate bandgap Egs and is lower than other bandgaps {Egj'} of the upper layer parts B (min{Egj}<hc/λ<Egs, {Egj'}), where h is Plank's constant, c is the vacuum light velocity and λ is a wavelength of the laser beam, separating the upper layer parts B as device chips C from the defect position controlled substrate in a vertical direction, simultaneously separating the upper layer parts B from each other in horizontal directions, and reusing the defect position controlled substrate S as a substrate for a next production.

5. The method as claimed in claim 1, wherein nitride semiconductor crystals grow at a high speed $V_{ZY}$ on the low defect density regions ZY and nitride semiconductor crystals grow at a low speed $V_H$ on the defect accumulating regions H of the defect position controlled substrate S ($V_H < V_{ZY}$).

6. The method as claimed in claim 2, wherein nitride semiconductor crystals grow at a high speed $V_{ZY}$ on the low defect density regions ZY and nitride semiconductor crystals grow at a low speed $V_H$ on the defect accumulating regions H of the defect position controlled substrate S ($V_H < V_{ZY}$).

7. The method as claimed in claim 3, wherein nitride semiconductor crystals grow at a high speed $V_{ZY}$ on the low defect density regions ZY and nitride semiconductor crystals grow at a low speed $V_H$ on the defect accumulating regions H of the defect position controlled substrate S ($V_H < V_{ZY}$).

8. The method as claimed in claim 4, wherein nitride semiconductor crystals grow at a high speed $V_{ZY}$ on the low defect density regions ZY and nitride semiconductor crystals grow at a low speed $V_H$ on the defect accumulating regions H of the defect position controlled substrate S ($V_H < V_{ZY}$).

9. The method as claimed in claim 1, wherein upper electrodes are formed on tops of the upper layer parts B on the defect position controlling substrate S before the separation of the upper layer parts B from the defect position controlling substrate S.

10. The method as claimed in claim 2, wherein upper electrodes are formed on tops of the upper layer parts B on the defect position controlling substrate S before the separation of the upper layer parts B from the defect position controlling substrate S.

11. The method as claimed in claim 3, wherein upper electrodes are formed on tops of the upper layer parts B on the defect position controlling substrate S before the separation of the upper layer parts B from the defect position controlling substrate S.

12. The method as claimed in claim 4, wherein upper electrodes are formed on tops of the upper layer parts B on the defect position controlling substrate S before the separation of the upper layer parts B from the defect position controlling substrate S.

13. The method as claimed in claim 5, wherein upper electrodes are formed on tops of the upper layer parts B on the defect position controlling substrate S before the separation of the upper layer parts B from the defect position controlling substrate S.

14. The method as claimed in claim 6, wherein upper electrodes are formed on tops of the upper layer parts B on the defect position controlling substrate S before the separation of the upper layer parts B from the defect position controlling substrate S.

15. The method as claimed in claim 7, wherein upper electrodes are formed on tops of the upper layer parts B on the defect position controlling substrate S before the separation of the upper layer parts B from the defect position controlling substrate S.

16. The method as claimed in claim 8, wherein upper electrodes are formed on tops of the upper layer parts B on the defect position controlling substrate S before the separation of the upper layer parts B from the defect position controlling substrate S.

17. The method as claimed in claim 1, wherein bottom electrodes are formed on bottoms of the chips C after the upper layer parts B are separated from the defect position controlling substrate S.

18. The method as claimed in claim 2, wherein bottom electrodes are formed on bottoms of the chips C after the upper layer parts B are separated from the defect position controlling substrate S.

19. The method as claimed in claim 3, wherein bottom electrodes are formed on bottoms of the chips C after the upper layer parts B are separated from the defect position controlling substrate S.

20. The method as claimed in claim 4, wherein bottom electrodes are formed on bottoms of the chips C after the upper layer parts B are separated from the defect position controlling substrate S.

21. The method as claimed in claim 5, wherein bottom electrodes are formed on bottoms of the chips C after the upper layer parts B are separated from the defect position controlling substrate S.

22. The method as claimed in claim 6, wherein bottom electrodes are formed on bottoms of the chips C after the upper layer parts B are separated from the defect position controlling substrate S.

23. The method as claimed in claim 7, wherein bottom electrodes are formed on bottoms of the chips C after the upper layer parts B are separated from the defect position controlling substrate S.

24. The method as claimed in claim 8, wherein bottom electrodes are formed on bottoms of the chips C after the upper layer parts B are separated from the defect position controlling substrate S.

25. The method as claimed in claim 9, wherein bottom electrodes are formed on bottoms of the chips C after the upper layer parts B are separated from the defect position controlling substrate S.

26. The method as claimed in claim 10, wherein bottom electrodes are formed on bottoms of the chips C after the upper layer parts B are separated from the defect position controlling substrate S.

27. The method as claimed in claim 11, wherein bottom electrodes are formed on bottoms of the chips C after the upper layer parts B are separated from the defect position controlling substrate S.

28. The method as claimed in claim 12, wherein bottom electrodes are formed on bottoms of the chips C after the upper layer parts B are separated from the defect position controlling substrate S.

29. The method as claimed in claim 13, wherein bottom electrodes are formed on bottoms of the chips C after the upper layer parts B are separated from the defect position controlling substrate S.

30. The method as claimed in claim 14, wherein bottom electrodes are formed on bottoms of the chips C after the upper layer parts B are separated from the defect position controlling substrate S.

31. The method as claimed in claim 15, wherein bottom electrodes are formed on bottoms of the chips C after the upper layer parts B are separated from the defect position controlling substrate S.

32. The method as claimed in claim 16, wherein bottom electrodes are formed on bottoms of the chips C after the upper layer parts B are separated from the defect position controlling substrate S.

33. The method as claimed in claim 3, wherein the fragile nitride separation layer Q is a nitride semiconductor layer with a thickness of 3 nm to 1000 nm being doped with carbon (C), iron (Fe) or magnesium (Mg).

34. The method as claimed in claim 2, wherein the nitride separation layer Q having a narrow bandgap is an InP layer with a thickness of 3 nm to 1000 nm.

35. The method as claimed in claim 1, wherein the diameter of the defect position controlled substrate S is 10 mm to 150 mm (6 inches), the upper layer part B has a horizontal diameter with 0.2 mm to 50 mm and a thickness of 10 μm to 600 μm.

36. The method as claimed in claim 2, wherein the diameter of the defect position controlled substrate S is 10 mm to 150 mm (6 inches), the upper layer part B has a horizontal diameter with 0.2 mm to 50 mm and a thickness of 10 μm to 600 μm.

37. The method as claimed in claim 3, wherein the diameter of the defect position controlled substrate S is 10 mm to 150 mm (6 inches), the upper layer part B has a horizontal diameter with 0.2 mm to 50 mm and a thickness of 10 μm to 600 μm.

38. The method as claimed in claim 4, wherein the diameter of the defect position controlled substrate S is 10 mm to 150 mm (6 inches), the upper layer part B has a horizontal diameter with 0.2 mm to 50 mm and a thickness of 10 μm to 600 μm.

39. The method as claimed in claim 5 wherein the diameter of the defect position controlled substrate S is 10 mm to 150 mm (6 inches), the upper layer part B has a horizontal diameter with 0.2 mm to 50 mm and a thickness of 10 μm to 600 μm.

40. The method as claimed in claim 6 wherein the diameter of the defect position controlled substrate S is 10 mm to 150 mm (6 inches), the upper layer part B has a horizontal diameter with 0.2 mm to 50 mm and a thickness of 10 μm to 600 μm.

41. The method as claimed in claim 7, wherein the diameter of the defect position controlled substrate S is 10 mm to 150 mm (6 inches), the upper layer part B has a horizontal diameter with 0.2 mm to 50 mm and a thickness of 10 μm to 600 μm.

42. The method as claimed in claim 8, wherein the diameter of the defect position controlled substrate S is 10 mm to 150 mm (6 inches), the upper layer part B has a horizontal diameter with 0.2 mm to 50 mm and a thickness of 10 μm to 600 μm.

43. The method as claimed in claim 9, wherein the diameter of the defect position controlled substrate S is 10 mm to 150 mm (6 inches), the upper layer part B has a horizontal diameter with 0.2 mm to 50 mm and a thickness of 10 μm to 600 μm.

44. The method as claimed in claim 10, wherein the diameter of the defect position controlled substrate S is 10 mm to 150 mm (6 inches), the upper layer part B has a horizontal diameter with 0.2 mm to 50 mm and a thickness of 10 μm to 600 μm.

45. The method as claimed in claim 11, wherein the diameter of the defect position controlled substrate S is 10 mm to 150 mm (6 inches), the upper layer part B has a horizontal diameter with 0.2 mm to 50 mm and a thickness of 10 μm to 600 μm.

46. The method as claimed in claim 12, wherein the diameter of the defect position controlled substrate S is 10 mm to 150 mm (6 inches), the upper layer part B has a horizontal diameter with 0.2 mm to 50 mm and a thickness of 10 μm to 600 μm.

47. The method as claimed in claim 13, wherein the diameter of the defect position controlled substrate S is 10 mm to 150 mm (6 inches), the upper layer part B has a horizontal diameter with 0.2 mm to 50 mm and a thickness of 10 μm to 600 μm.

48. The method as claimed in claim 14, wherein the diameter of the defect position controlled substrate S is 10 mm to 150 mm (6 inches), the upper layer part B has a horizontal diameter with 0.2 mm to 50 mm and a thickness of 10 μm to 600 μm.

49. The method as claimed in claim 15, wherein the diameter of the defect position controlled substrate S is 10 mm to 150 mm (6 inches), the upper layer part B has a horizontal diameter with 0.2 mm to 50 mm and a thickness of 10 μm to 600 μm.

50. The method as claimed in claim 16, wherein the diameter of the defect position controlled substrate S is 10 mm to 150 mm (6 inches), the upper layer part B has a horizontal diameter with 0.2 mm to 50 mm and a thickness of 10 μm to 600 μm.

51. The method as claimed in claim 17, wherein the diameter of the defect position controlled substrate S is 10 mm to 150 mm (6 inches), the upper layer part B has a horizontal diameter with 0.2 mm to 50 mm and a thickness of 10 μm to 600 μm.

52. The method as claimed in claim 18, wherein the diameter of the defect position controlled substrate S is 10 mm to 150 mm (6 inches), the upper layer part B has a horizontal diameter with 0.2 mm to 50 mm and a thickness of 10 μm to 600 μm.

53. The method as claimed in claim 19, wherein the diameter of the defect position controlled substrate S is 10 mm to 150 mm (6 inches), the upper layer part B has a horizontal diameter with 0.2 mm to 50 mm and a thickness of 10 μm to 600 μm.

54. The method as claimed in claim 20, wherein the diameter of the defect position controlled substrate S is 10 mm to 150 mm (6 inches), the upper layer part B has a horizontal diameter with 0.2 mm to 50 mm and a thickness of 10 μm to 600 μm.

55. The method as claimed in claim 21, wherein the diameter of the defect position controlled substrate S is 10 mm to 150 mm (6 inches), the upper layer part B has a horizontal diameter with 0.2 mm to 50 mm and a thickness of 10 μm to 600 μm.

56. The method as claimed in claim 22, wherein the diameter of the defect position controlled substrate S is 10 mm to 150 mm (6 inches), the upper layer part B has a horizontal diameter with 0.2 mm to 50 mm and a thickness of 10 μm to 600 μm.

57. The method as claimed in claim 23, wherein the diameter of the defect position controlled substrate S is 10 mm to 150 mm (6 inches), the upper layer part B has a horizontal diameter with 0.2 mm to 50 mm and a thickness of 10 μm to 600 μm.

58. The method as claimed in claim 24, wherein the diameter of the defect position controlled substrate S is 10 mm to 150 mm (6 inches), the upper layer part B has a horizontal diameter with 0.2 mm to 50 mm and a thickness of 10 μm to 600 μm.

59. The method as claimed in claim 25, wherein the diameter of the defect position controlled substrate S is 10 mm to 150 mm (6 inches), the upper layer part B has a horizontal diameter with 0.2 mm to 50 mm and a thickness of 10 μm to 600 μm.

60. The method as claimed in claim 26, wherein the diameter of the defect position controlled substrate S is 10 mm to 150 mm (6 inches), the upper layer part B has a horizontal diameter with 0.2 mm to 50 mm and a thickness of 10 μm to 600 μm.

61. The method as claimed in claim 27, wherein the diameter of the defect position controlled substrate S is 10 mm to 150 mm (6 inches), the upper layer part B has a horizontal diameter with 0.2 mm to 50 mm and a thickness of 10 μm to 600 μm.

62. The method as claimed in claim 28, wherein the diameter of the defect position controlled substrate S is 10 mm to 150 mm (6 inches), the upper layer part B has a horizontal diameter with 0.2 mm to 50 mm and a thickness of 10 μm to 600 μm.

63. The method as claimed in claim 29, wherein the diameter of the defect position controlled substrate S is 10 mm to 150 mm (6 inches), the upper layer part B has a horizontal diameter with 0.2 mm to 50 mm and a thickness of 10 μm to 600 μm.

64. The method as claimed in claim 30, wherein the diameter of the defect position controlled substrate S is 10 mm to 150 mm (6 inches), the upper layer part B has a horizontal diameter with 0.2 mm to 50 mm and a thickness of 10 μm to 600 μm.

65. The method as claimed in claim 31, wherein the diameter of the defect position controlled substrate S is 10 mm to 150 mm (6 inches), the upper layer part B has a horizontal diameter with 0.2 mm to 50 mm and a thickness of 10 μm to 600 μm.

66. The method as claimed in claim 32, wherein the diameter of the defect position controlled substrate S is 10 mm to 150 mm (6 inches), the upper layer part B has a horizontal diameter with 0.2 mm to 50 mm and a thickness of 10 μm to 600 μm.

67. The method as claimed in claim 33, wherein the diameter of the defect position controlled substrate S is 10 mm to 150 mm (6 inches), the upper layer part B has a horizontal diameter with 0.2 mm to 50 mm and a thickness of 10 μm to 600 μm.

68. The method as claimed in claim 34, wherein the diameter of the defect position controlled substrate S is 10 mm to 150 mm (6 inches), the upper layer part B has a horizontal diameter with 0.2 mm to 50 mm and a thickness of 10 μm to 600 μm.

* * * * *